US009835792B2

(12) United States Patent
Harrold et al.

(10) Patent No.: US 9,835,792 B2
(45) Date of Patent: Dec. 5, 2017

(54) DIRECTIONAL BACKLIGHT

(71) Applicant: RealD Inc., Beverly Hills, CA (US)

(72) Inventors: Jonathan Harrold, Leamington Spa (GB); Graham J. Woodgate, Henley-on-Thames (GB)

(73) Assignee: RealD Spark, LLC, Beverly Hills, CA (US)

( * ) Notice: Subject to any disclaimer, the term of this patent is extended or adjusted under 35 U.S.C. 154(b) by 193 days.

(21) Appl. No.: 14/877,196

(22) Filed: Oct. 7, 2015

(65) Prior Publication Data

US 2016/0131825 A1 May 12, 2016

Related U.S. Application Data

(60) Provisional application No. 62/061,467, filed on Oct. 8, 2014.

(51) Int. Cl.
*H05K 1/05* (2006.01)
*F21V 8/00* (2006.01)
(Continued)

(52) U.S. Cl.
CPC ......... *G02B 6/0083* (2013.01); *G02B 6/0068* (2013.01); *G02B 6/0073* (2013.01); *G02F 1/1323* (2013.01); *G02F 1/133615* (2013.01); *H01L 25/00* (2013.01); *H05K 1/05* (2013.01); *G02F 2001/133612* (2013.01); *H05K 2201/10106* (2013.01)

(58) Field of Classification Search
CPC .. G02B 6/0068; G02B 6/0073; G02B 6/0083; G02F 1/1323; G02F 1/133615; G02F 2001/133612; H05K 1/05; H05K 2201/10106
See application file for complete search history.

(56) References Cited

U.S. PATENT DOCUMENTS 1,128,979 A 2/1915 Hess
1,970,311 A 8/1934 Ives
(Continued)

FOREIGN PATENT DOCUMENTS

CN 1142869 A 2/1997
CN 1377453 A 10/2002
(Continued)

OTHER PUBLICATIONS

AU-2013262869 Australian Office Action of Australian Patent Office dated Feb. 22, 2016.
(Continued)

*Primary Examiner* — Peggy Neils
(74) *Attorney, Agent, or Firm* — Penny L. Lowry; Neil G. Mothew

(57) ABSTRACT

An electrical connection assembly for a directional display comprising a directional backlight may include stack of flat connectors and a strip comprising an end portion with an array of light sources and a base portion with an array of connectors. The end portion and base portion may be shaped so that the base portion extends outwardly from the end portion. Light sources of the directional display may be individually addressable by means of a highly compact arrangement of connections, achieving low thickness and small bezel width.

21 Claims, 22 Drawing Sheets

(51) Int. Cl.
*H01L 25/00* (2006.01)
*G02F 1/13* (2006.01)
*G02F 1/1335* (2006.01)

(56) References Cited

U.S. PATENT DOCUMENTS

| | | |
|---|---|---|
| 2,133,121 A | 10/1938 | Stearns |
| 2,247,969 A | 7/1941 | Lemuel |
| 2,480,178 A | 8/1949 | Zinberg |
| 2,810,905 A | 10/1957 | Barlow |
| 3,409,351 A | 11/1968 | Winnek |
| 3,715,154 A | 2/1973 | Bestenreiner |
| 4,057,323 A | 11/1977 | Ward |
| 4,528,617 A | 7/1985 | Blackington |
| 4,542,958 A | 9/1985 | Young |
| 4,804,253 A | 2/1989 | Stewart |
| 4,807,978 A | 2/1989 | Grinberg et al. |
| 4,829,365 A | 5/1989 | Eichenlaub |
| 4,914,553 A | 4/1990 | Hamada et al. |
| 5,050,946 A | 9/1991 | Hathaway et al. |
| 5,278,608 A | 1/1994 | Taylor et al. |
| 5,347,644 A | 9/1994 | Sedlmayr |
| 5,349,419 A | 9/1994 | Taguchi et al. |
| 5,459,592 A | 10/1995 | Shibatani et al. |
| 5,466,926 A | 11/1995 | Sasano et al. |
| 5,510,831 A | 4/1996 | Mayhew |
| 5,528,720 A | 6/1996 | Winston et al. |
| 5,581,402 A | 12/1996 | Taylor |
| 5,588,526 A | 12/1996 | Fantone et al. |
| 5,697,006 A | 12/1997 | Taguchi et al. |
| 5,703,667 A | 12/1997 | Ochiai |
| 5,727,107 A | 3/1998 | Umemoto et al. |
| 5,771,066 A | 6/1998 | Barnea |
| 5,796,451 A | 8/1998 | Kim |
| 5,808,792 A | 9/1998 | Woodgate et al. |
| 5,850,580 A | 12/1998 | Taguchi et al. |
| 5,875,055 A | 2/1999 | Morishima et al. |
| 5,896,225 A | 4/1999 | Chikazawa |
| 5,903,388 A | 5/1999 | Sedlmayr |
| 5,933,276 A | 8/1999 | Magee |
| 5,956,001 A | 9/1999 | Sumida et al. |
| 5,959,664 A | 9/1999 | Woodgate |
| 5,959,702 A | 9/1999 | Goodman |
| 5,969,850 A | 10/1999 | Harrold et al. |
| 5,971,559 A | 10/1999 | Ishikawa et al. |
| 6,008,484 A | 12/1999 | Woodgate et al. |
| 6,014,164 A | 1/2000 | Woodgate et al. |
| 6,023,315 A | 2/2000 | Harrold et al. |
| 6,044,196 A | 3/2000 | Winston et al. |
| 6,055,013 A | 4/2000 | Woodgate et al. |
| 6,061,179 A | 5/2000 | Inoguchi et al. |
| 6,061,489 A | 5/2000 | Ezra et al. |
| 6,064,424 A | 5/2000 | Berkel et al. |
| 6,075,557 A | 6/2000 | Holliman et al. |
| 6,094,216 A | 7/2000 | Taniguchi et al. |
| 6,108,059 A | 8/2000 | Yang |
| 6,118,584 A | 9/2000 | Berkel et al. |
| 6,128,054 A | 10/2000 | Schwarzenberger |
| 6,144,118 A | 11/2000 | Cahill et al. |
| 6,172,723 B1 | 1/2001 | Inoue et al. |
| 6,199,995 B1 | 3/2001 | Umemoto et al. |
| 6,219,113 B1 | 4/2001 | Takahara |
| 6,224,214 B1 | 5/2001 | Martin et al. |
| 6,232,592 B1 | 5/2001 | Sugiyama |
| 6,256,447 B1 | 7/2001 | Laine |
| 6,262,786 B1 | 7/2001 | Perlo et al. |
| 6,295,109 B1 | 9/2001 | Kubo et al. |
| 6,302,541 B1 | 10/2001 | Grossmann |
| 6,305,813 B1 | 10/2001 | Lekson et al. |
| 6,335,999 B1 | 1/2002 | Winston et al. |
| 6,373,637 B1 | 4/2002 | Gulick et al. |
| 6,377,295 B1 | 4/2002 | Woodgate et al. |
| 6,422,713 B1 | 7/2002 | Fohl et al. |
| 6,456,340 B1 | 9/2002 | Margulis |
| 6,464,365 B1 | 10/2002 | Gunn et al. |
| 6,476,850 B1 | 11/2002 | Erbey |
| 6,481,849 B2 | 11/2002 | Martin et al. |
| 6,654,156 B1 | 11/2003 | Crossland et al. |
| 6,663,254 B2 | 12/2003 | Ohsumi |
| 6,724,452 B1 | 4/2004 | Takeda et al. |
| 6,731,355 B2 | 5/2004 | Miyashita |
| 6,736,512 B2 | 5/2004 | Balogh |
| 6,798,406 B1 | 9/2004 | Jones et al. |
| 6,801,243 B1 | 10/2004 | Berkel |
| 6,816,158 B1 | 11/2004 | Lemelson et al. |
| 6,825,985 B2 | 11/2004 | Brown et al. |
| 6,847,354 B2 | 1/2005 | Vranish |
| 6,847,488 B2 | 1/2005 | Travis |
| 6,859,240 B1 | 2/2005 | Brown et al. |
| 6,867,828 B2 | 3/2005 | Taira et al. |
| 6,870,671 B2 | 3/2005 | Travis |
| 6,883,919 B2 | 4/2005 | Travis |
| 7,001,058 B2 | 2/2006 | Inditsky |
| 7,052,168 B2 | 5/2006 | Epstein et al. |
| 7,058,252 B2 | 6/2006 | Woodgate et al. |
| 7,073,933 B2 | 7/2006 | Gotoh et al. |
| 7,091,931 B2 | 8/2006 | Yoon |
| 7,101,048 B2 | 9/2006 | Travis |
| 7,136,031 B2 | 11/2006 | Lee et al. |
| 7,215,391 B2 | 5/2007 | Kuan et al. |
| 7,215,415 B2 | 5/2007 | Maehara et al. |
| 7,215,475 B2 | 5/2007 | Woodgate et al. |
| 7,227,567 B1 | 6/2007 | Beck et al. |
| 7,239,293 B2 | 7/2007 | Perlin et al. |
| 7,365,908 B2 | 4/2008 | Dolgoff |
| 7,375,886 B2 | 5/2008 | Lipton et al. |
| 7,410,286 B2 | 8/2008 | Travis |
| 7,430,358 B2 | 9/2008 | Qi et al. |
| 7,492,346 B2 | 2/2009 | Manabe et al. |
| 7,528,893 B2 | 5/2009 | Schultz et al. |
| 7,545,429 B2 | 6/2009 | Travis |
| 7,587,117 B2 | 9/2009 | Winston et al. |
| 7,614,777 B2 | 11/2009 | Koganezawa et al. |
| 7,660,047 B1 | 2/2010 | Travis et al. |
| 7,750,981 B2 | 7/2010 | Shestak et al. |
| 7,750,982 B2 | 7/2010 | Nelson et al. |
| 7,771,102 B2 | 8/2010 | Iwasaki |
| 7,798,698 B2 | 9/2010 | Segawa |
| 7,798,699 B2 | 9/2010 | Laitinen et al. |
| 7,944,428 B2 | 5/2011 | Travis |
| 7,970,246 B2 | 6/2011 | Travis et al. |
| 7,976,208 B2 | 7/2011 | Travis |
| 8,016,475 B2 | 9/2011 | Travis |
| 8,179,361 B2 | 5/2012 | Sugimoto et al. |
| 8,216,405 B2 | 7/2012 | Emerton et al. |
| 8,223,296 B2 | 7/2012 | Lee et al. |
| 8,251,562 B2 | 8/2012 | Kuramitsu et al. |
| 8,325,295 B2 | 12/2012 | Sugita et al. |
| 8,354,806 B2 | 1/2013 | Travis et al. |
| 8,477,261 B2 | 7/2013 | Travis et al. |
| 8,502,253 B2 | 8/2013 | Min |
| 8,534,901 B2 | 9/2013 | Panagotacos et al. |
| 8,556,491 B2 | 10/2013 | Lee |
| 8,651,725 B2 | 2/2014 | Ie et al. |
| 8,684,588 B2 | 4/2014 | Ajichi et al. |
| 8,714,804 B2 | 5/2014 | Kim et al. |
| 8,752,995 B2 | 6/2014 | Park |
| 8,760,762 B1 | 6/2014 | Kelly et al. |
| 8,926,112 B2 | 1/2015 | Uchiike et al. |
| 8,942,434 B1 | 1/2015 | Karakotsios et al. |
| 9,188,731 B2 | 11/2015 | Woodgate et al. |
| 9,197,884 B2 | 11/2015 | Lee et al. |
| 9,350,980 B2 | 5/2016 | Robinson et al. |
| 9,519,153 B2 | 12/2016 | Robinson et al. |
| 2001/0001566 A1 | 5/2001 | Moseley et al. |
| 2001/0050686 A1 | 12/2001 | Allen |
| 2002/0018299 A1 | 2/2002 | Daniell |
| 2002/0113246 A1 | 8/2002 | Nagai et al. |
| 2002/0113866 A1 | 8/2002 | Taniguchi et al. |
| 2003/0046839 A1 | 3/2003 | Oda et al. |
| 2003/0117790 A1 | 6/2003 | Lee et al. |
| 2003/0133191 A1 | 7/2003 | Morita et al. |
| 2003/0137738 A1 | 7/2003 | Ozawa et al. |
| 2003/0137821 A1 | 7/2003 | Gotoh et al. |

(56) References Cited

U.S. PATENT DOCUMENTS

| | | |
|---|---|---|
| 2004/0008877 A1 | 1/2004 | Leppard et al. |
| 2004/0015729 A1 | 1/2004 | Elms et al. |
| 2004/0021809 A1 | 2/2004 | Sumiyoshi et al. |
| 2004/0042233 A1 | 3/2004 | Suzuki et al. |
| 2004/0046709 A1 | 3/2004 | Yoshino |
| 2004/0105264 A1 | 6/2004 | Spero |
| 2004/0108971 A1 | 6/2004 | Waldern et al. |
| 2004/0109303 A1 | 6/2004 | Olczak |
| 2004/0135741 A1 | 7/2004 | Tomisawa et al. |
| 2004/0170011 A1 | 9/2004 | Kim et al. |
| 2004/0263968 A1 | 12/2004 | Kobayashi et al. |
| 2004/0263969 A1 | 12/2004 | Lipton et al. |
| 2005/0007753 A1 | 1/2005 | Hees et al. |
| 2005/0094295 A1 | 5/2005 | Yamashita et al. |
| 2005/0110980 A1 | 5/2005 | Maehara et al. |
| 2005/0135116 A1 | 6/2005 | Epstein et al. |
| 2005/0174768 A1 | 8/2005 | Conner |
| 2005/0180167 A1 | 8/2005 | Hoelen et al. |
| 2005/0190180 A1 | 9/2005 | Jin et al. |
| 2005/0190345 A1 | 9/2005 | Dubin et al. |
| 2005/0237488 A1 | 10/2005 | Yamasaki et al. |
| 2005/0254127 A1 | 11/2005 | Evans et al. |
| 2005/0264717 A1 | 12/2005 | Chien et al. |
| 2005/0274956 A1 | 12/2005 | Bhat |
| 2005/0276071 A1 | 12/2005 | Sasagawa et al. |
| 2005/0280637 A1 | 12/2005 | Ikeda et al. |
| 2006/0002678 A1 | 1/2006 | Weber et al. |
| 2006/0012845 A1 | 1/2006 | Edwards |
| 2006/0056166 A1 | 3/2006 | Yeo et al. |
| 2006/0114664 A1 | 6/2006 | Sakata et al. |
| 2006/0132423 A1 | 6/2006 | Travis |
| 2006/0139447 A1 | 6/2006 | Unkrich |
| 2006/0158729 A1 | 7/2006 | Vissenberg et al. |
| 2006/0176912 A1 | 8/2006 | Anikitchev |
| 2006/0203200 A1 | 9/2006 | Koide |
| 2006/0215129 A1 | 9/2006 | Alasaarela et al. |
| 2006/0221642 A1 | 10/2006 | Daiku |
| 2006/0227427 A1 | 10/2006 | Dolgoff |
| 2006/0244918 A1 | 11/2006 | Cossairt et al. |
| 2006/0250580 A1 | 11/2006 | Silverstein et al. |
| 2006/0262376 A1 | 11/2006 | Mather et al. |
| 2006/0269213 A1 | 11/2006 | Hwang et al. |
| 2006/0284974 A1 | 12/2006 | Lipton et al. |
| 2006/0291053 A1 | 12/2006 | Robinson et al. |
| 2006/0291243 A1 | 12/2006 | Niioka et al. |
| 2007/0008406 A1 | 1/2007 | Shestak et al. |
| 2007/0013624 A1 | 1/2007 | Bourhill |
| 2007/0025680 A1 | 2/2007 | Winston et al. |
| 2007/0035706 A1 | 2/2007 | Margulis |
| 2007/0035829 A1 | 2/2007 | Woodgate et al. |
| 2007/0035964 A1 | 2/2007 | Olczak |
| 2007/0081110 A1 | 4/2007 | Lee |
| 2007/0085105 A1 | 4/2007 | Beeson et al. |
| 2007/0109400 A1 | 5/2007 | Woodgate et al. |
| 2007/0109401 A1 | 5/2007 | Lipton et al. |
| 2007/0115551 A1 | 5/2007 | Spilman et al. |
| 2007/0115552 A1 | 5/2007 | Robinson et al. |
| 2007/0153160 A1 | 7/2007 | Lee et al. |
| 2007/0183466 A1 | 8/2007 | Son et al. |
| 2007/0188667 A1 | 8/2007 | Schwerdtner |
| 2007/0189701 A1 | 8/2007 | Chakmakjian et al. |
| 2007/0223252 A1 | 9/2007 | Lee et al. |
| 2007/0279554 A1 | 12/2007 | Kowarz et al. |
| 2007/0279727 A1 | 12/2007 | Gandhi et al. |
| 2008/0079662 A1 | 4/2008 | Saishu et al. |
| 2008/0084519 A1 | 4/2008 | Brigham et al. |
| 2008/0086289 A1 | 4/2008 | Brott |
| 2008/0128728 A1 | 6/2008 | Nemchuk et al. |
| 2008/0225205 A1 | 9/2008 | Travis |
| 2008/0259012 A1 | 10/2008 | Fergason |
| 2008/0259643 A1 | 10/2008 | Ijzerman et al. |
| 2008/0291359 A1 | 11/2008 | Miyashita |
| 2008/0297431 A1 | 12/2008 | Yuuki et al. |
| 2008/0297459 A1 | 12/2008 | Sugimoto et al. |
| 2008/0304282 A1 | 12/2008 | Mi et al. |
| 2008/0316768 A1 | 12/2008 | Travis |
| 2009/0014700 A1 | 1/2009 | Metcalf et al. |
| 2009/0016057 A1 | 1/2009 | Rinko |
| 2009/0040426 A1 | 2/2009 | Mather et al. |
| 2009/0067156 A1 | 3/2009 | Bonnett et al. |
| 2009/0109705 A1 | 4/2009 | Pakhchyan et al. |
| 2009/0128735 A1 | 5/2009 | Larson et al. |
| 2009/0135623 A1 | 5/2009 | Kunimochi |
| 2009/0140656 A1 | 6/2009 | Kohashikawa et al. |
| 2009/0160757 A1 | 6/2009 | Robinson |
| 2009/0167651 A1 | 7/2009 | Benitez et al. |
| 2009/0168459 A1 | 7/2009 | Holman et al. |
| 2009/0174700 A1 | 7/2009 | Daiku |
| 2009/0174840 A1 | 7/2009 | Lee et al. |
| 2009/0190072 A1 | 7/2009 | Nagata et al. |
| 2009/0190079 A1 | 7/2009 | Saitoh |
| 2009/0207629 A1 | 8/2009 | Fujiyama et al. |
| 2009/0225380 A1 | 9/2009 | Schwerdtner et al. |
| 2009/0278936 A1 | 11/2009 | Pastoor et al. |
| 2009/0290203 A1 | 11/2009 | Schwerdtner |
| 2009/0315915 A1 | 12/2009 | Dunn et al. |
| 2010/0034987 A1 | 2/2010 | Fujii et al. |
| 2010/0040280 A1 | 2/2010 | McKnight |
| 2010/0053771 A1 | 3/2010 | Travis et al. |
| 2010/0053938 A1 | 3/2010 | Kim et al. |
| 2010/0091093 A1 | 4/2010 | Robinson |
| 2010/0091254 A1 | 4/2010 | Travis et al. |
| 2010/0103649 A1* | 4/2010 | Hamada ............... H01R 23/667 362/97.1 |
| 2010/0165598 A1 | 7/2010 | Chen et al. |
| 2010/0177387 A1 | 7/2010 | Travis et al. |
| 2010/0182542 A1 | 7/2010 | Nakamoto et al. |
| 2010/0188438 A1 | 7/2010 | Kang |
| 2010/0188602 A1 | 7/2010 | Feng |
| 2010/0214135 A1 | 8/2010 | Bathiche et al. |
| 2010/0220260 A1 | 9/2010 | Sugita et al. |
| 2010/0231498 A1 | 9/2010 | Large et al. |
| 2010/0271838 A1 | 10/2010 | Yamaguchi |
| 2010/0277575 A1 | 11/2010 | Ismael et al. |
| 2010/0278480 A1 | 11/2010 | Vasylyev |
| 2010/0289870 A1 | 11/2010 | Leister |
| 2010/0295920 A1 | 11/2010 | McGowan |
| 2010/0295930 A1 | 11/2010 | Ezhov |
| 2010/0300608 A1 | 12/2010 | Emerton et al. |
| 2010/0302135 A1 | 12/2010 | Larson et al. |
| 2010/0309296 A1 | 12/2010 | Harrold et al. |
| 2010/0321953 A1 | 12/2010 | Coleman et al. |
| 2010/0328438 A1 | 12/2010 | Ohyama et al. |
| 2011/0013417 A1 | 1/2011 | Saccomanno et al. |
| 2011/0019112 A1 | 1/2011 | Dolgoff |
| 2011/0032483 A1 | 2/2011 | Hruska et al. |
| 2011/0032724 A1 | 2/2011 | Kinoshita |
| 2011/0043142 A1 | 2/2011 | Travis et al. |
| 2011/0043501 A1 | 2/2011 | Daniel |
| 2011/0044056 A1 | 2/2011 | Travis et al. |
| 2011/0044579 A1 | 2/2011 | Travis et al. |
| 2011/0051237 A1 | 3/2011 | Hasegawa et al. |
| 2011/0187293 A1 | 8/2011 | Travis |
| 2011/0187635 A1 | 8/2011 | Lee et al. |
| 2011/0188120 A1 | 8/2011 | Tabirian et al. |
| 2011/0199459 A1 | 8/2011 | Barenbrug et al. |
| 2011/0211142 A1 | 9/2011 | Kashiwagi et al. |
| 2011/0216266 A1 | 9/2011 | Travis |
| 2011/0221998 A1 | 9/2011 | Adachi et al. |
| 2011/0228183 A1 | 9/2011 | Hamagishi |
| 2011/0228562 A1 | 9/2011 | Travis et al. |
| 2011/0235359 A1 | 9/2011 | Liu et al. |
| 2011/0242150 A1 | 10/2011 | Song et al. |
| 2011/0242277 A1 | 10/2011 | Do et al. |
| 2011/0242298 A1 | 10/2011 | Bathiche et al. |
| 2011/0255303 A1 | 10/2011 | Nichol et al. |
| 2011/0267563 A1 | 11/2011 | Shimizu |
| 2011/0285927 A1 | 11/2011 | Schultz et al. |
| 2011/0292321 A1 | 12/2011 | Travis et al. |
| 2011/0310232 A1 | 12/2011 | Wilson et al. |
| 2012/0002136 A1 | 1/2012 | Nagata et al. |
| 2012/0002295 A1 | 1/2012 | Dobschal et al. |
| 2012/0008067 A1 | 1/2012 | Mun et al. |
| 2012/0013720 A1 | 1/2012 | Kadowaki et al. |

(56) References Cited

U.S. PATENT DOCUMENTS

| | | |
|---|---|---|
| 2012/0056971 A1 | 3/2012 | Kumar et al. |
| 2012/0062991 A1 | 3/2012 | Krijn et al. |
| 2012/0063166 A1 | 3/2012 | Panagotacos et al. |
| 2012/0075285 A1 | 3/2012 | Oyagi et al. |
| 2012/0081920 A1 | 4/2012 | Ie et al. |
| 2012/0086776 A1 | 4/2012 | Lo |
| 2012/0092435 A1 | 4/2012 | Wohlert |
| 2012/0106193 A1 | 5/2012 | Kim et al. |
| 2012/0127573 A1 | 5/2012 | Robinson et al. |
| 2012/0154450 A1 | 6/2012 | Aho et al. |
| 2012/0162966 A1 | 6/2012 | Kim et al. |
| 2012/0169838 A1 | 7/2012 | Sekine |
| 2012/0206050 A1 | 8/2012 | Spero |
| 2012/0236484 A1 | 9/2012 | Miyake |
| 2012/0243204 A1 | 9/2012 | Robinson |
| 2012/0243261 A1 | 9/2012 | Yamamoto et al. |
| 2012/0293721 A1 | 11/2012 | Ueyama |
| 2012/0299913 A1 | 11/2012 | Robinson et al. |
| 2012/0314145 A1 | 12/2012 | Robinson |
| 2012/0327172 A1 | 12/2012 | El-Saban et al. |
| 2013/0077027 A1* | 3/2013 | Griffin ................ G02B 6/0028 349/65 |
| 2013/0101253 A1 | 4/2013 | Popovich et al. |
| 2013/0107340 A1 | 5/2013 | Wong et al. |
| 2013/0127861 A1 | 5/2013 | Gollier |
| 2013/0135588 A1 | 5/2013 | Popovich et al. |
| 2013/0156265 A1 | 6/2013 | Hennessy |
| 2013/0169701 A1 | 7/2013 | Whitehead et al. |
| 2013/0230136 A1 | 9/2013 | Sakaguchi et al. |
| 2013/0235561 A1 | 9/2013 | Etienne et al. |
| 2013/0294684 A1 | 11/2013 | Lipton et al. |
| 2013/0307831 A1 | 11/2013 | Robinson et al. |
| 2013/0307946 A1 | 11/2013 | Robinson et al. |
| 2013/0308339 A1 | 11/2013 | Woodgate et al. |
| 2013/0321599 A1 | 12/2013 | Harrold et al. |
| 2013/0328866 A1 | 12/2013 | Woodgate et al. |
| 2013/0335821 A1 | 12/2013 | Robinson et al. |
| 2014/0009508 A1 | 1/2014 | Woodgate et al. |
| 2014/0016354 A1 | 1/2014 | Lee et al. |
| 2014/0022619 A1 | 1/2014 | Woodgate et al. |
| 2014/0036361 A1 | 2/2014 | Woodgate et al. |
| 2014/0041205 A1 | 2/2014 | Robinson et al. |
| 2014/0043323 A1 | 2/2014 | Sumi |
| 2014/0098558 A1 | 4/2014 | Vasylyev |
| 2014/0126238 A1 | 5/2014 | Kao et al. |
| 2014/0240344 A1 | 8/2014 | Tomono et al. |
| 2014/0240828 A1 | 8/2014 | Robinson et al. |
| 2014/0289835 A1 | 9/2014 | Varshavsky et al. |
| 2014/0340728 A1 | 11/2014 | Taheri |
| 2014/0368602 A1 | 12/2014 | Woodgate et al. |
| 2015/0116212 A1 | 4/2015 | Freed et al. |
| 2015/0268479 A1 | 9/2015 | Woodgate et al. |
| 2015/0334365 A1 | 11/2015 | Tsubaki et al. |
| 2015/0339512 A1 | 11/2015 | Son et al. |
| 2015/0371585 A1* | 12/2015 | Bower .................... G09G 3/32 345/1.1 |

FOREIGN PATENT DOCUMENTS

| | | | |
|---|---|---|---|
| CN | 1454329 A | | 11/2003 |
| CN | 1466005 A | | 1/2004 |
| CN | 1487332 A | | 4/2004 |
| CN | 1588196 A | | 3/2005 |
| CN | 1678943 A | | 10/2005 |
| CN | 1696788 A | | 11/2005 |
| CN | 1769971 A | | 5/2006 |
| CN | 1823292 A | | 8/2006 |
| CN | 1826553 A | | 8/2006 |
| CN | 1866112 A | | 11/2006 |
| CN | 1900785 A | | 1/2007 |
| CN | 1908753 A | | 2/2007 |
| CN | 1910399 A | | 2/2007 |
| CN | 2872404 | | 2/2007 |
| CN | 1307481 | | 3/2007 |
| CN | 101029975 A | | 9/2007 |
| CN | 101049028 A | | 10/2007 |
| CN | 200983052 | | 11/2007 |
| CN | 101114080 A | | 1/2008 |
| CN | 101142823 A | | 3/2008 |
| CN | 101266338 A | | 9/2008 |
| CN | 100449353 | | 1/2009 |
| CN | 101364004 A | | 2/2009 |
| CN | 101598863 B | | 12/2009 |
| CN | 100591141 | | 2/2010 |
| CN | 101660689 A | | 3/2010 |
| CN | 102147079 A | | 8/2011 |
| CN | 202486493 U | | 10/2012 |
| EP | 0653891 A1 | | 5/1995 |
| EP | 0721131 A2 | | 7/1996 |
| EP | 0830984 A2 | | 3/1998 |
| EP | 0833183 A1 | | 4/1998 |
| EP | 0860729 A2 | | 8/1998 |
| EP | 0939273 A1 | | 9/1999 |
| EP | 0656555 B1 | | 3/2003 |
| EP | 1736702 A1 | | 12/2006 |
| EP | 2003394 A2 | | 12/2008 |
| EP | 1394593 B1 | | 6/2010 |
| EP | 2219067 A1 | | 8/2010 |
| EP | 2451180 A2 | | 5/2012 |
| EP | 1634119 B1 | | 8/2012 |
| GB | 2405542 | | 2/2005 |
| JP | H07270792 | | 10/1995 |
| JP | H08211334 | | 8/1996 |
| JP | H08237691 A | | 9/1996 |
| JP | H08254617 | | 10/1996 |
| JP | H08070475 | | 12/1996 |
| JP | H08340556 | | 12/1996 |
| JP | H1042315 A | | 2/1998 |
| JP | H10142556 A | | 5/1998 |
| JP | H11242908 A | | 9/1999 |
| JP | 2000048618 A | | 2/2000 |
| JP | 2000069504 A | | 3/2000 |
| JP | 2000131683 A | | 5/2000 |
| JP | 2000200049 A | | 7/2000 |
| JP | 2001093321 A | | 4/2001 |
| JP | 2002049004 A | | 2/2002 |
| JP | 2003215349 A | | 7/2003 |
| JP | 2003215705 A | | 7/2003 |
| JP | 2004112814 A | | 4/2004 |
| JP | 2004265813 A | | 9/2004 |
| JP | 2004319364 A | | 11/2004 |
| JP | 2005135844 A | | 5/2005 |
| JP | 2005181914 A | | 7/2005 |
| JP | 2005183030 A | | 7/2005 |
| JP | 2005203182 A | | 7/2005 |
| JP | 2005259361 A | | 9/2005 |
| JP | 2006004877 A | | 1/2006 |
| JP | 2006010935 A | | 1/2006 |
| JP | 2006031941 A | | 2/2006 |
| JP | 2006310269 A | | 11/2006 |
| JP | 2007094035 A | | 4/2007 |
| JP | 3968742 B2 | | 8/2007 |
| JP | 2007273288 A | | 10/2007 |
| JP | 2007286652 | | 11/2007 |
| JP | 2008204874 A | | 9/2008 |
| JP | 2010160527 A | | 7/2010 |
| JP | 2011192468 A | | 9/2011 |
| JP | 2011216281 A | | 10/2011 |
| JP | 2012060607 A | | 3/2012 |
| JP | 2013015619 | | 1/2013 |
| JP | 2013502693 | | 1/2013 |
| JP | 2013540083 | | 10/2013 |
| KR | 20030064258 | | 7/2003 |
| KR | 20090932304 | | 12/2009 |
| KR | 20110006773 A | | 1/2011 |
| KR | 20110017918 A | | 2/2011 |
| KR | 20110067534 A | | 6/2011 |
| KR | 20120048301 A | | 5/2012 |
| KR | 20120049890 A | | 5/2012 |
| KR | 20130002646 A | | 1/2013 |
| KR | 20140139730 | | 12/2014 |
| TW | 200528780 | | 9/2005 |
| WO | 9406249 B1 | | 4/1994 |

(56) References Cited

FOREIGN PATENT DOCUMENTS

| WO | 9520811 A1 | 8/1995 |
|---|---|---|
| WO | 9527915 A1 | 10/1995 |
| WO | 9821620 A1 | 5/1998 |
| WO | 9911074 A1 | 3/1999 |
| WO | 0127528 A1 | 4/2001 |
| WO | 0161241 A1 | 8/2001 |
| WO | 0179923 A1 | 10/2001 |
| WO | 2008038539 A1 | 4/2008 |
| WO | 2008045681 A1 | 4/2008 |
| WO | 2009098809 A1 | 8/2009 |
| WO | 2010021926 A2 | 2/2010 |
| WO | 2011020962 A1 | 2/2011 |
| WO | 2011022342 A2 | 2/2011 |
| WO | 2011068907 A1 | 6/2011 |
| WO | 2011149739 A2 | 12/2011 |
| WO | 2014130860 A1 | 8/2014 |

OTHER PUBLICATIONS

Bahadur, "Liquid crystals applications and uses," World Scientific, vol. 1, pp. 178 (1990).
CN-201180065590.0 Office first action dated Dec. 31, 2014.
CN-201180065590.0 Office second action dated Oct. 21, 2015.
CN-201180065590.0 Office Third action dated Jun. 6, 2016.
CN-201380026047.9 Chinese 1st Office Action of the State Intellectual Property Office of P.R. dated Dec. 18, 2015.
CN-201380026050.0 Chinese 1st Office Action of the State Intellectual Property Office of P.R. dated Jun. 3, 2016.
CN-201380026059.1 Chinese 1st Office Action of the State Intellectual Property Office of P.R. dated Apr. 25, 2016.
CN-201380026076.5 Office first action dated May 11, 2016.
CN-201380049451.8 Chinese Office Action of the State Intellectual Property Office of P.R. dated Apr. 5, 2016.
EP-07864751.8 European Search Report dated Jun. 1, 2012.
EP-07864751.8 Supplementary European Search Report dated May 29, 2015.
EP-11842021.5 Office Action dated Oct. 2, 2015.
EP-13758536.0 European Extended Search Report of European Patent Office dated Feb. 4, 2016.
EP-13790013.0 European Extended Search Report of European Patent Office dated Jan. 26, 2016.
EP-13790141.9 European Extended Search Report of European Patent Office dated Feb. 11, 2016.
EP-13790195.5 European Extended Search Report of European Patent Office dated Mar. 2, 2016.
EP-13790267.2 European Extended Search Report of European Patent Office dated Feb. 25, 2016.
EP-13790274.8 European Extended Search Report of European Patent Office dated Feb. 8, 2016.
EP-13790775.4 European Extended Search Report of European Patent Office dated Oct. 9, 2015.
EP-13790809.1 European Extended Search Report of European Patent Office dated Feb. 16, 2016.
EP-13790942.0 European Extended Search Report of European Patent Office dated May 23, 2016.
EP-13791332.3 European Extended Search Report of European Patent Office dated Feb. 1, 2016.
EP-13791437.0 European Extended Search Report of European Patent Office dated Oct. 14, 2015.
EP-13843659.7 European Extended Search Report of European Patent Office dated May 10, 2016.
EP-13844510.1 European Extended Search Report of European Patent Office dated May 13, 2016.
PCT/US2013/041683 International search report and written opinion of international searching authority dated Aug. 27, 2013.
JP-2013540083 Notice of reasons for rejection dated Jun. 30, 2015.
PCT/US2013/041655 International search report and written opinion of international searching authority dated Aug. 27, 2013.
PCT/US2013/041619 International search report and written opinion of international searching authority dated Aug. 27, 2013.
Kalantar, et al. "Backlight Unit With Double Surface Light Emission," J. Soc. Inf. Display, vol. 12, Issue 4, pp. 379-387 (Dec. 2004).
Languy et al., "Performance comparison of four kinds of flat nonimaging Fresnel lenses made of polycarbonates and polymethyl methacrylate for concentrated photovoltaics", Optics Letters, 36, pp. 2743-2745.
Lipton, "Stereographics: Developers' Handbook", Stereographic Developers Handbook, Jan. 1, 1997, XP002239311, p. 42-49.
PCT/US2013/041548 International search report and written opinion of international searching authority dated Aug. 27, 2013.
PCT/US2007/85475 International search report and written opinion dated Apr. 10, 2008.
PCT/US2013/041237 International search report and written opinion of international searching authority dated May 15, 2013.
PCT/US2009/060686 international search report and written opinion of international searching authority dated Dec. 10, 2009.
PCT/US2011/061511 International search report and written opinion of international searching authority dated Jun. 29, 2012.
PCT/US2011/061511 International Preliminary Report on Patentability dated May 21, 2013.
PCT/US2012/037677 International search report and written opinion of international searching authority dated Jun. 29, 2012.
PCT/US2012/042279 International search report and written opinion of international searching authority dated Feb. 26, 2013.
PCT/US2012/052189 International search report and written opinion of the international searching authority dated Jan. 29, 2013.
PCT/US2013/041192 International search report and written opinion of international searching authority dated Aug. 28, 2013.
PCT/US2013/041228 International search report and written opinion of international searching authority dated Aug. 23, 2013.
PCT/US2013/041235 International search report and written opinion of international searching authority dated Aug. 23, 2013.
PCT/US2013/041697 International search report and written opinion of international searching authority dated Aug. 23, 2013.
PCT/US2013/041703 International search report and written opinion of international searching authority dated Aug. 27, 2013.
PCT/US2013/049969 International search report and written opinion of international searching authority dated Oct. 23, 2013
PCT/US2013/063125 International search report and written opinion of international searching authority dated Jan. 20, 2014.
PCT/US2013/063133 International search report and written opinion of international searching authority dated Jan. 20, 2014.
PCT/US2013/077288 International search report and written opinion of international searching authority dated Apr. 18, 2014.
PCT/US2014/017779 International search report and written opinion of international searching authority dated May 28, 2014.
PCT/US2014/042721 International search report and written opinion of international searching authority dated Oct. 10, 2014.
PCT/US2014/060312 International search report and written opinion of international searching authority dated Jan. 19, 2015.
PCT/US2014/060368 International search report and written opinion of international searching authority dated Jan. 14, 2015.
PCT/US2014/065020 International search report and written opinion of international searching authority dated May 21, 2015.
PCT/US2015/021583 International search report and written opinion of international searching authority dated Sep. 10, 2015.
PCT/US2015/038024 International search report and written opinion of international searching authority dated Dec. 30, 2015.
Robinson et al., U.S. Appl. No. 14/751,878 entitled "Directional privacy display" filed Jun. 26, 2015.
Robinson et al., U.S. Appl. No. 15/097,750 entitled "Wide angle imaging directional backlights" filed Apr. 13, 2016.
Robinson et al., U.S. Appl. No. 15/098,084 entitled "Wide angle imaging directional backlights" filed Apr. 13, 2016.
Robinson, U.S. Appl. No. 13/300,293 entitled "Directional flat illuminators" filed Nov. 18, 2011.
RU-2013122560 First office action dated Jan. 22, 2014.
RU-2013122560 Second office action dated Apr. 10, 2015.
Tabiryan et al., "The Promise of Diffractive Waveplates," Optics and Photonics News, vol. 21, Issue 3, pp. 40-45 (Mar. 2010).

(56) References Cited

OTHER PUBLICATIONS

Travis, et al. "Backlight for view-sequential autostereo 3D", Microsoft E&DD Applied Sciences, (date unknown), 25 pages.
Williams S P et al., "New Computational Control Techniques and Increased Understanding for Stereo 3-D Displays", Proceedings of SPIE, SPIE, US, vol. 1256, Jan. 1, 1990, XP000565512, p. 75, 77, 79.
3M™ ePrivacy Filter software professional version; http://www.cdw.com/shop/products/3M-ePrivacy-Filter-software-professional-version/3239412.aspx?cm_mmc=ShoppingFeeds-_-ChannelIntelligence-_-Software-_-3239412_3MT%20ePrivacy%20Filter%20software%20professional%20version_3MF-EPFPRO&cpncode=37-7582919&srccode=cii_10191459#PO; Copyright 2007-2016.
AU-2011329639 Australia Patent Examination Report No. 1 dated Mar. 6, 2014.
AU-2014218711 Examination report No. 1 dated Mar. 20, 2017.
AU-2015258258 Australian Office Action of Australian Patent Office dated Jun. 9, 2016.
Beato: "Understanding Comfortable stereography", Dec. 31, 2011 (Dec. 31, 2011), XP055335952, Retrieved from the Internet: URL:http://64.17.134.112/Affonso Beato/Understanding Comfortable Stereography.html [retrieved-on Jan. 17, 2017].
Braverman: "The 3D Toolbox : News", Aug. 13, 2010 (Aug. 13, 2010), XP055336081, Retrieved from the Internet: URL:http://www.dashwood3d.com/blog/the-3d-toolbox/ [retrieved on Jan. 17, 2017].
CA-2817044 Canadian office action dated Jul. 14, 2016.
CN-201180065590.0 Office fourth action dated Jan. 4, 2017.
CN-201280034488.9 2d Office Action from the State Intellectual Property Office of P.R. China dated Mar. 22, 2016.
CN-201280034488.9 1st Office Action from the State Intellectual Property Office of P.R. China dated Jun. 11, 2015.
CN-201380026045.X Chinese First Office Action of Chinese Patent Office dated Aug. 29, 2016.
CN-201380026046.4 Chinese 1st Office Action of the State Intellectual Property Office of P.R. China dated Oct. 24, 2016.
CN-201380026047.9 Chinese 2d Office Action of the State Intellectual Property Office of P.R. dated Jul. 12, 2016.
CN-201380026050.0 Chinese 2nd Office Action of the State Intellectual Property Office of P.R. dated Apr. 1, 2017.
CN-201380026058.7 Chinese 1st Office Action of the State Intellectual Property Office of P.R. China dated Nov. 2, 2016.
CN-201380026059.1 Chinese 2nd Office Action of the State Intellectual Property Office of P.R. dated Feb. 22, 2017.
CN-201380063047.6 Chinese Office Action of the State Intellectual Property Office of P.R. China dated Oct. 9, 2016.
CN-201380063055.0 Chinese 1st Office Action of the State Intellectual Property Office of P.R. dated Jun. 23, 2016.
CN-201380073381.X Chinese Office Action of the State Intellectual Property Office of P.R. China dated Nov. 16, 2016.
CN-201480023023.2 Office first action dated Aug. 12, 2016.
CN-201480023023.2 Office second action dated May 11, 2017.
Cootes et al., "Active Appearance Models", IEEE Trans. Pattern Analysis and Machine Intelligence, 23(6):681-685, 2001.
Cootes et al., "Active Shape Models—Their Training and Application" Computer Vision and Image Understanding 61 (1):38-59 Jan. 1995.
Dalal et al., "Histogram of Oriented Gradients for Human Detection", Computer Vision and Pattern Recognition, pp. 886-893, 2005.
Drucker et al., "Support Vector Regression Machines", Advances in Neural Information Processing Systems 9, pp. 155-161, NIPS 1996.
EP-09817048.3 European Search Report dated Apr. 29, 2016.
EP-11842021.5 Office Action dated Sep. 2, 2016.
EP-13790775.4 Office Action dated Aug. 29, 2016.
EP-13791437.0 European first office action dated Aug. 30, 2016.
EP-13822472.0 European Extended Search Report of European Patent Office dated Mar. 2, 2016.
EP-13865893.5 European Extended Search Report of European Patent Office dated Oct. 6, 2016.
EP-14754859.8 European Extended Search Report of European Patent Office dated Oct. 14, 2016.
EP-14813739.1 European Extended Search Report of European Patent Office dated Jan. 25, 2017.
EP-14853532.1 European Extended Search Report of European Patent Office dated May 23, 2017.
Ho, "Random Decision Forests", Proceedings of the 3rd International Conference on Document Analysis and Recognition, Montreal, QC, pp. 278-282, Aug. 14-16, 1995.
Ian Sexton et al: "Stereoscopic and autostereoscopic display-systems",—IEEE Signal Processing Magazine, May 1, 1999 (May 1, 1999), pp. 85-99, XP055305471, Retrieved from the Internet: RL:http://ieeexplore.ieee.org/iel5/79/16655/00768575.pdf [retrieved on Sep. 26, 2016].
JP-200980150139.1 1st Office Action dated Nov. 2, 2014.
JP-200980150139.1 2d Office Action dated May 4, 2015.
JP-2015-512794 1st Office Action (translated) dated Feb. 14, 2017.
JP-2015-512809 1st Office Action dated Mar. 28, 2017.
JP-2015-512810 1st Office Action (translated) dated Feb. 7, 2017.
JP-2015-512879 1st Office Action (translated) dated Apr. 11, 2017.
JP-2015-512887 1st Office Action (translated) dated Feb. 7, 2017.
JP-2015-512896 1st Office Action (translated) dated May 9, 2017.
JP-2015-512901 1st Office Action dated Mar. 28, 2017.
JP-2015-512905 1st Office Action (translated) dated Feb. 7, 2017.
Kononenko et al., "Learning to Look Up: Realtime Monocular Gaze Correction Using Machine Learning", Computer Vision and Pattern Recognition, pp. 4667-4675, 2015.
KR-20117010839 1st Office action (translated) dated Aug. 28, 2015.
KR-20117010839 2d Office action (translated) dated Apr. 28, 2016.
KR-20137015775 Office action (translated) dated Oct. 18, 2016.
Lipton: "Stereoscopic Composition Lenny Lipton", Feb. 15, 2009 (Feb. 15, 2009), XP055335930, Retrieved from the Internet: URL: https://lennylipton.wordpress.com/2009/02/15/stereoscopic-composition/ [retrieved on Jan. 17, 2017].
Lowe, "Distinctive Image Features from Scale-Invariant Keypoints", International Journal of Computer Vision 60 (2), pp. 91-110, 2004.
Lucio et al: "RGBD Camera Effects", Aug. 1, 2012 (Aug. 1, 2012), XP055335831, SIBGRAPI—Conference on Graphics, Patterns and Images Retrieved from the Internet: URL:https://www.researchgate.net/profile/Leandro Cruz/publication/233398182 RGBD Camera Effects/links/0912f50a2922010eb2000000.pdf [retrieved on Jan. 17, 2017].
Marjanovic, M., "Interlace, Interleave, and Field Dominance," http://www.mir.com/DMG/interl.html, pp. 1-5 (2001).
Ozuysal et al., "Fast Keypoint recognition in Ten Lines of Code", Computer Vision and Pattern Recognition, pp. 1-8, 2007.
PCT/US2007/85475 International preliminary report on patentability dated May 26, 2009.
PCT/US2014/057860 International Preliminary Report on Patentability dated Apr. 5, 2016.
PCT/US2014/057860 International search report and written opinion of international searching authority dated Jan. 5, 2015.
PCT/US2015/000327 International search report and written opinion of international searching authority dated Apr. 25, 2016.
PCT/US2015/054523 International search report and written opinion of international searching authority dated Mar. 18, 2016.
PCT/US2016/027297 International search report and written opinion of international searching authority dated Jul. 26, 2016.
PCT/US2016/027350 International search report and written opinion of the international searching authority dated Jul. 25, 2016.
PCT/US2016/034418 International search report and written opinion of the international searching authority dated Sep. 7, 2016.
PCT/US2016/056410 International search report and written opinion of the international searching authority dated Jan. 25, 2017.
PCT/US2016/058695 International search report and written opinion of international searching authority dated Feb. 28, 2017.
PCT/US2016/061428 International search report and written opinion of international searching authority dated Jan. 20, 2017.
PCT/US2017/012203 International search report and written opinion of international searching authority dated Apr. 18, 2017.
Robinson et al., U.S. Appl. No. 15/165,960 entitled "Wide Angle Imaging Directional Backlights" filed May 26, 2016.

(56) References Cited

OTHER PUBLICATIONS

Robinson et al., U.S. Appl. No. 15/290,543 entitled "Wide angle imaging directional backlights" filed Oct. 11, 2016.
RU-201401264 Office action dated Jan. 18, 2017.
Travis, et al. "Collimated light from a waveguide for a display," Optics Express, vol. 17, No. 22, pp. 19714-19719 (2009).
Viola and Jones, "Rapid Object Detection using a Boosted Cascade of Simple Features", pp. 1-9 CVPR 2001.
Zach et al., "A Duality Based Approach for Realtime TV-L1 Optical Flow", Pattern Recognition (Proc. DAGM), 2007, pp. 214-223.
CN-201380026064.2 Chinese First Office Action of Chinese Patent Office dated Jun. 9, 2017.

\* cited by examiner

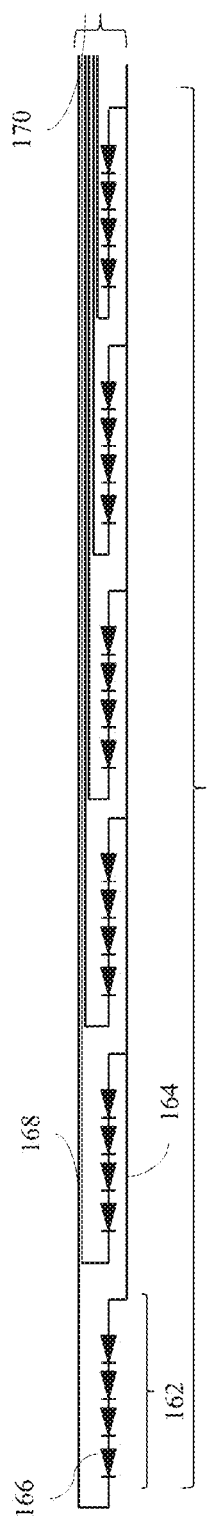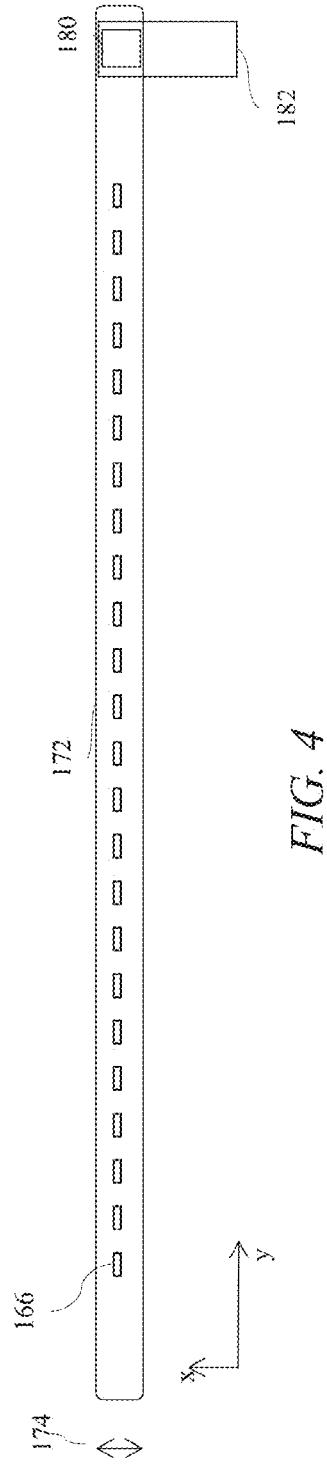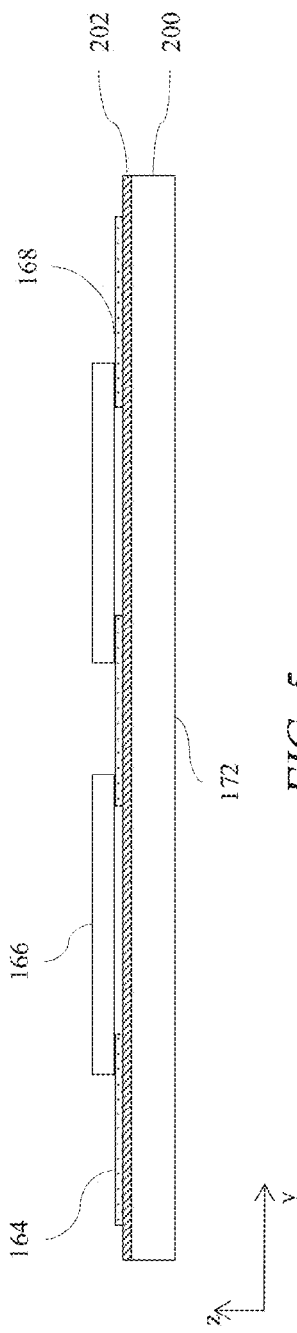

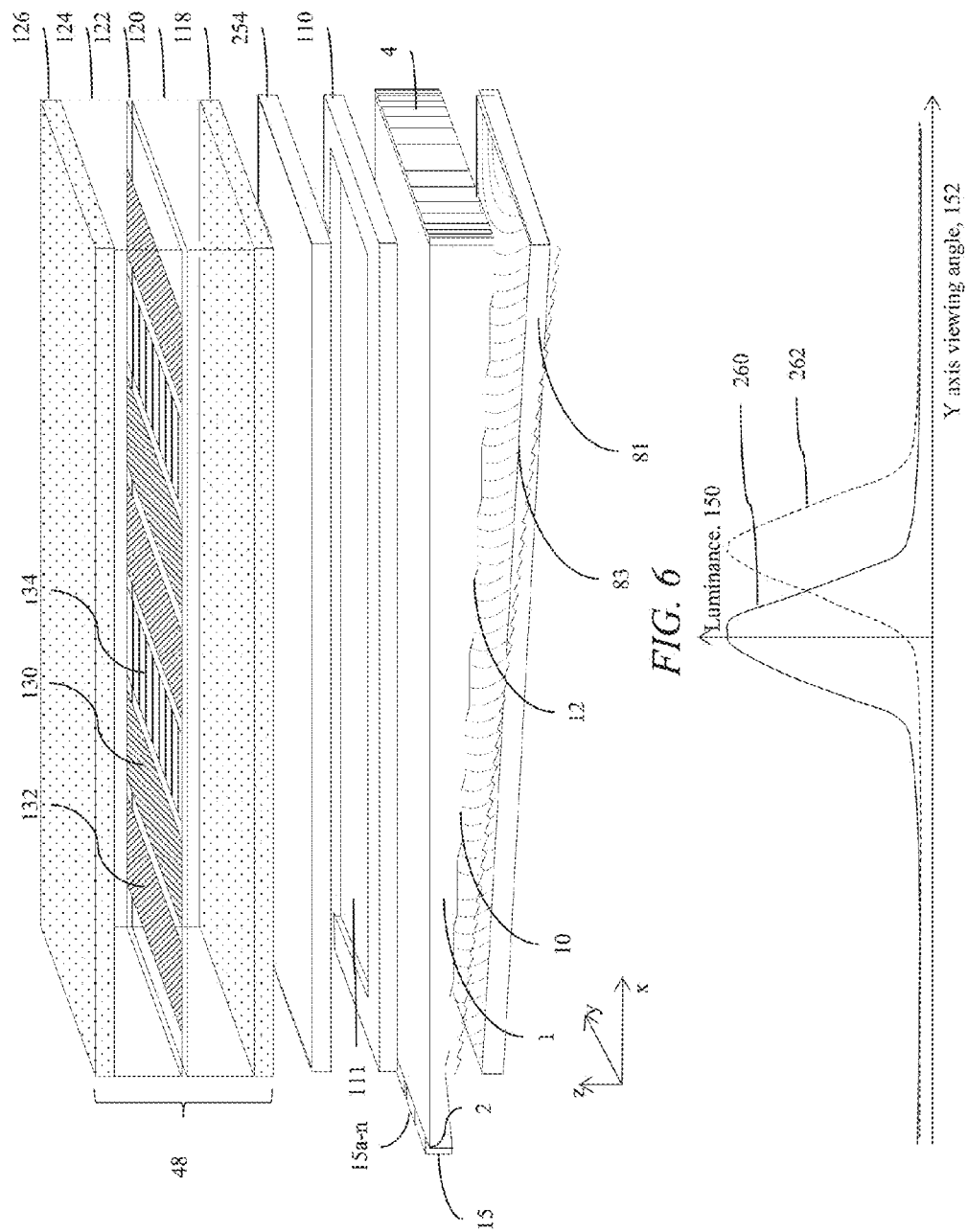

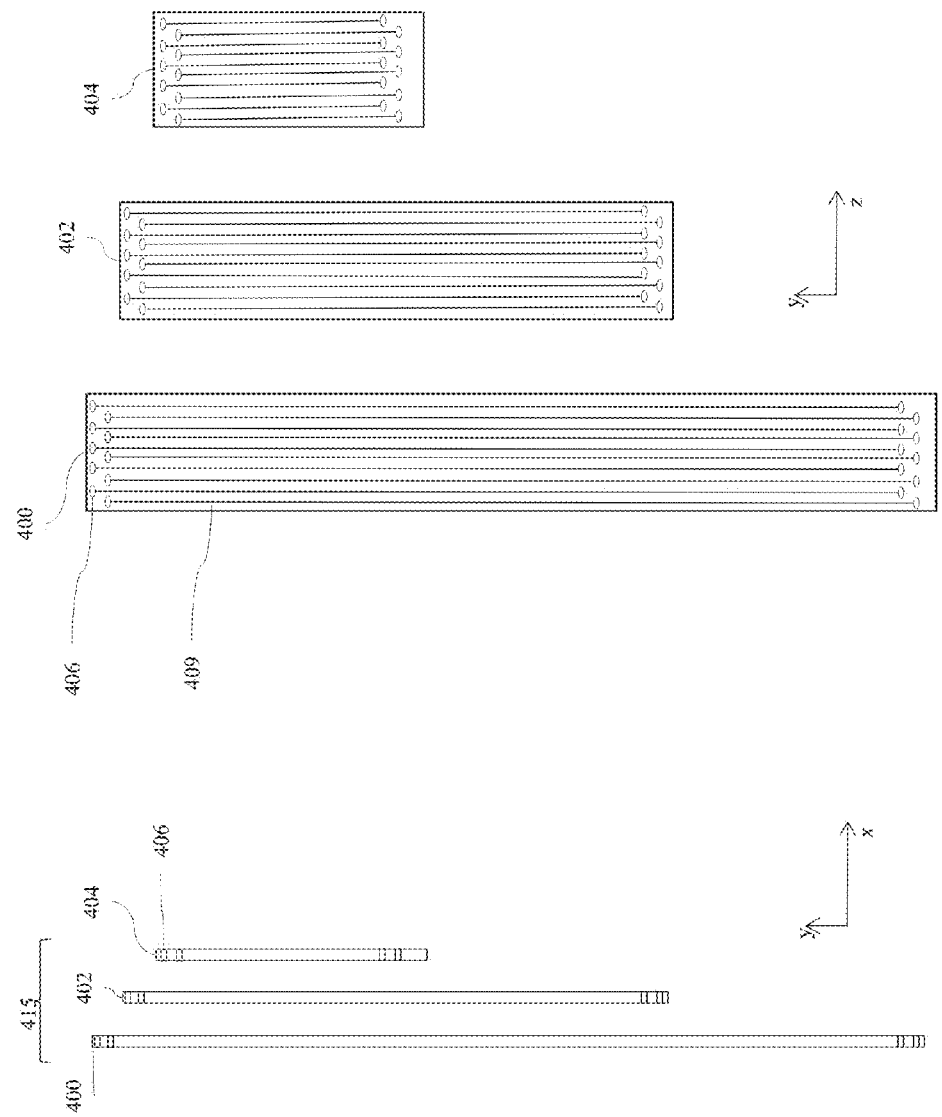

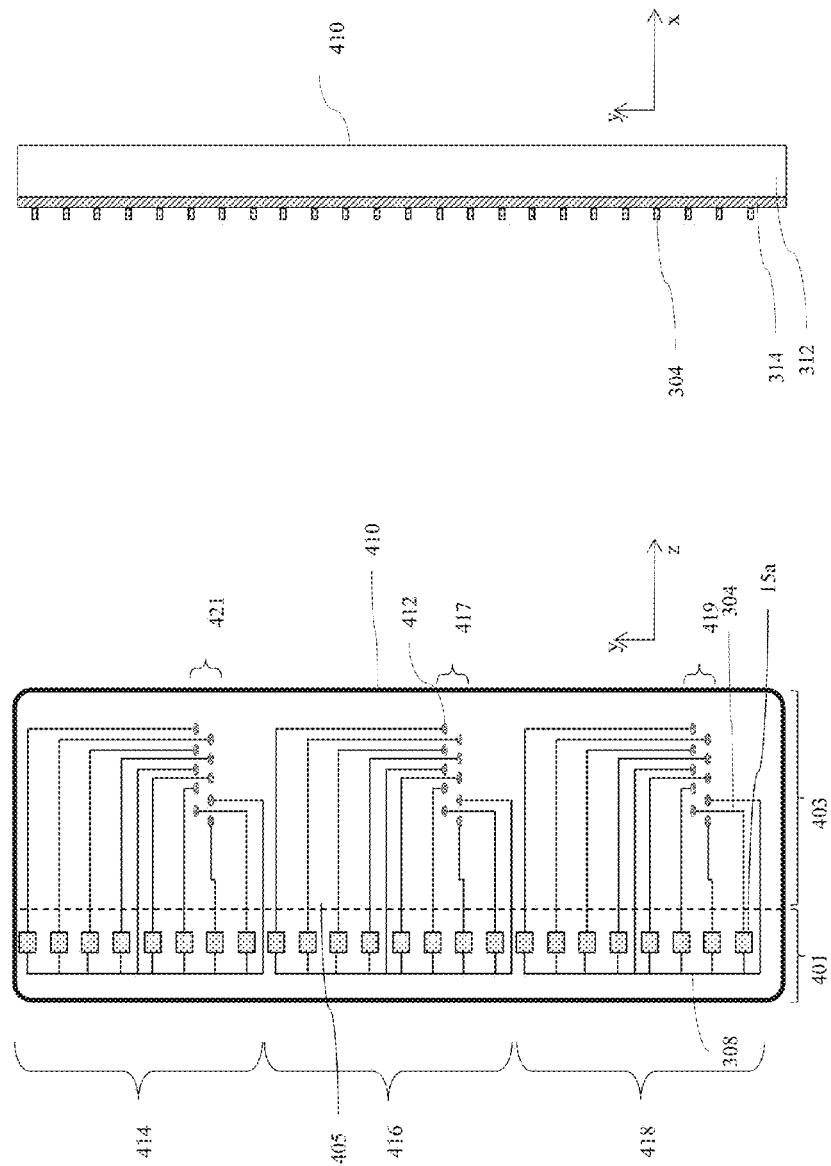

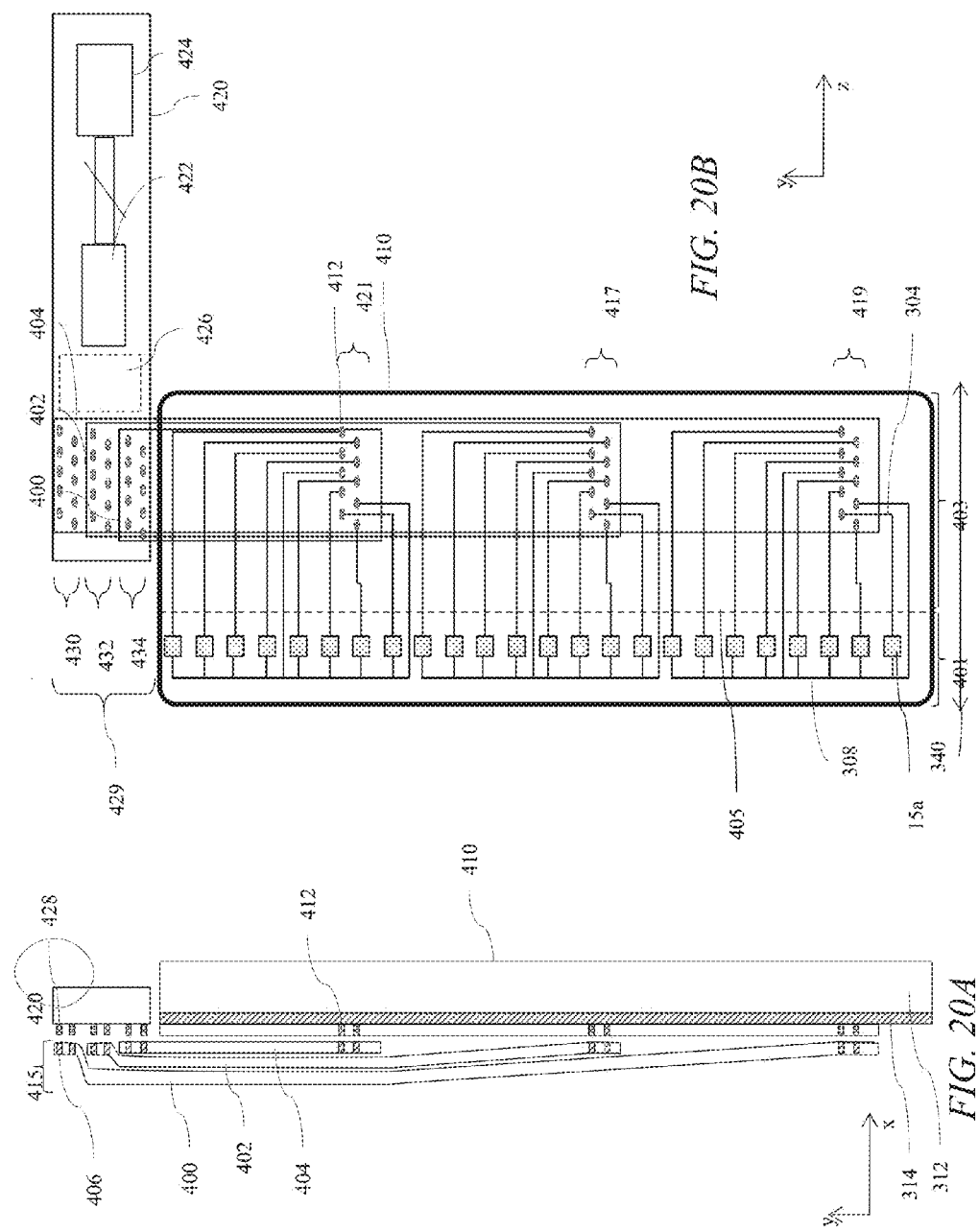

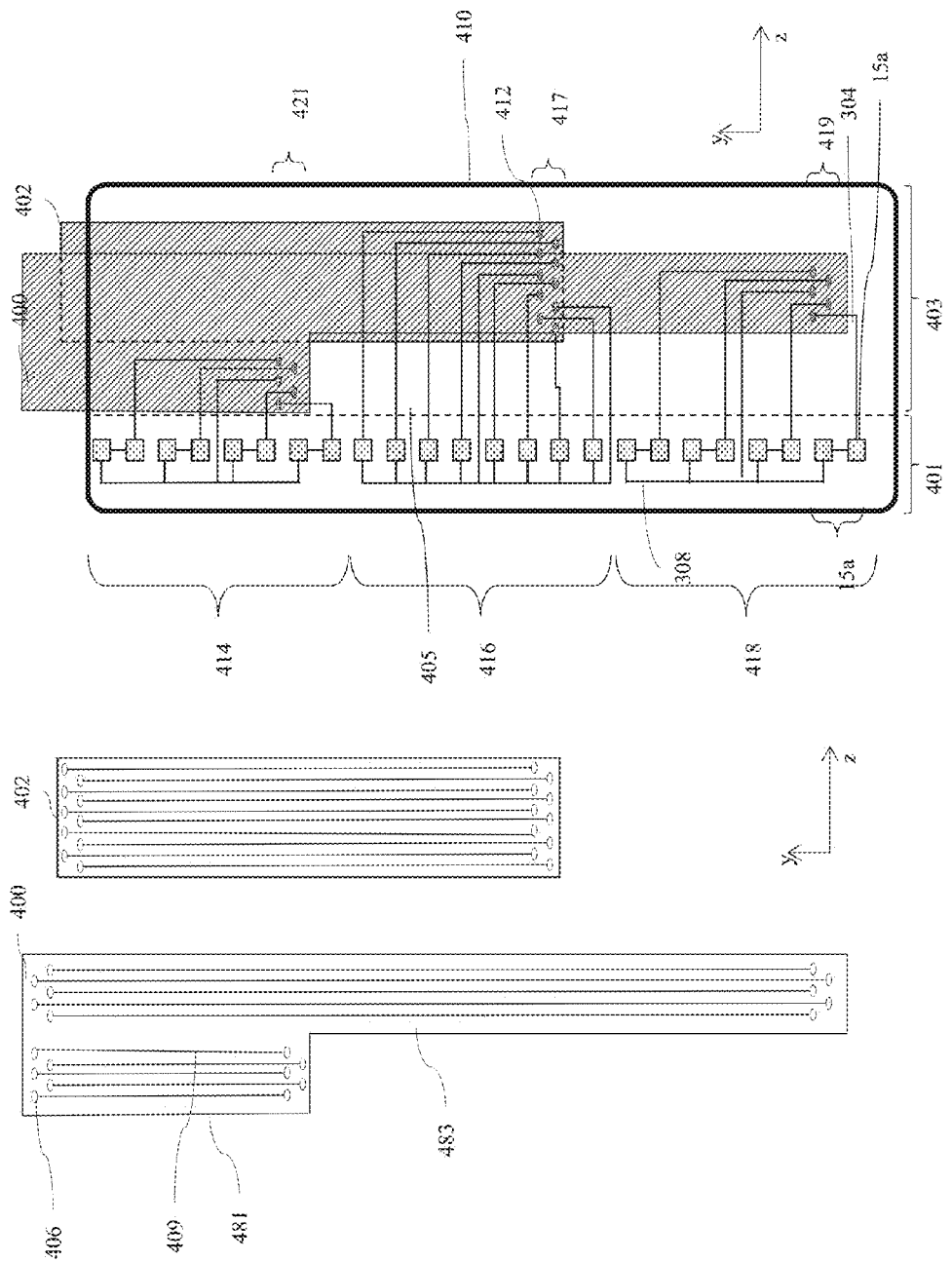

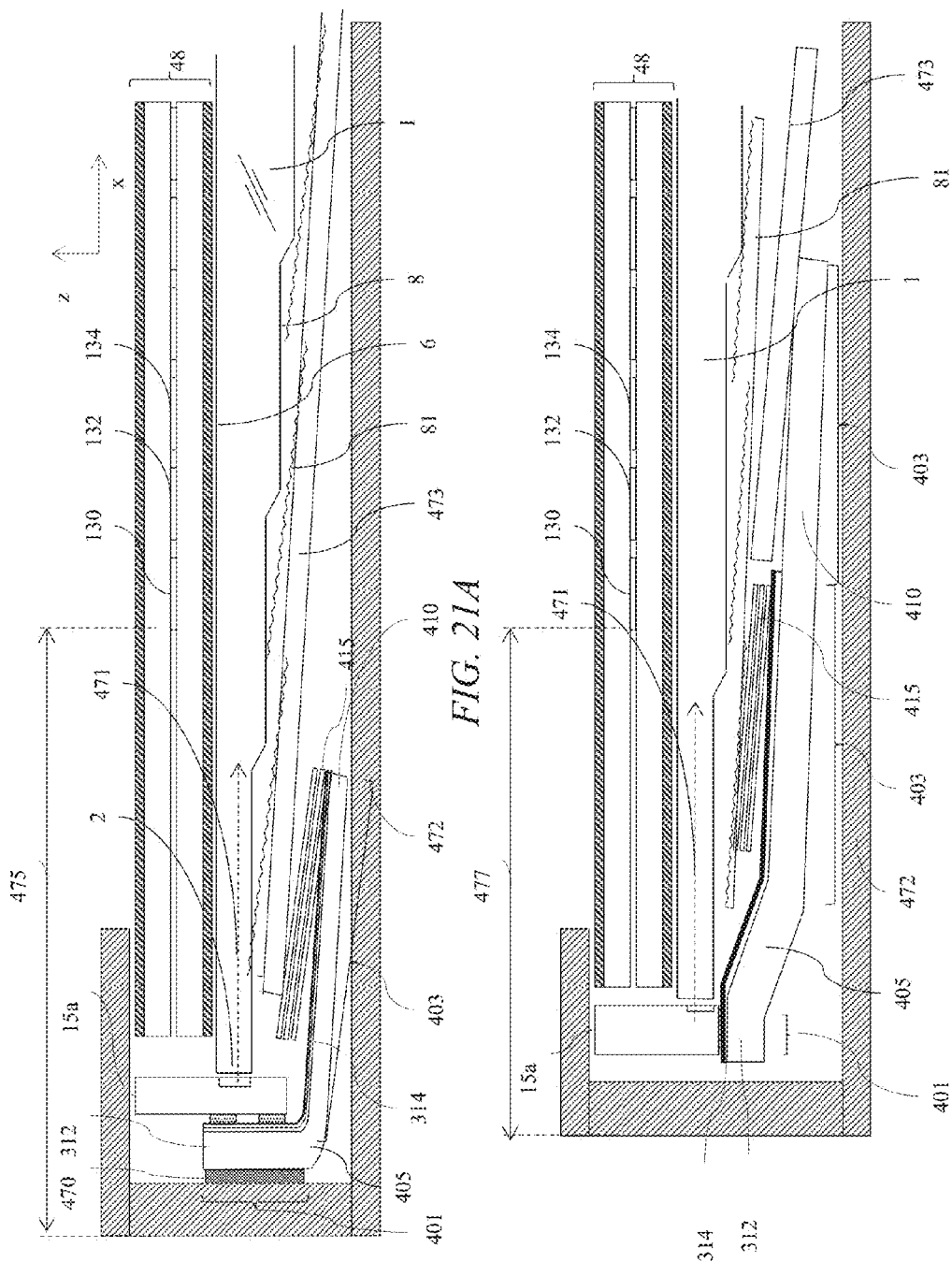

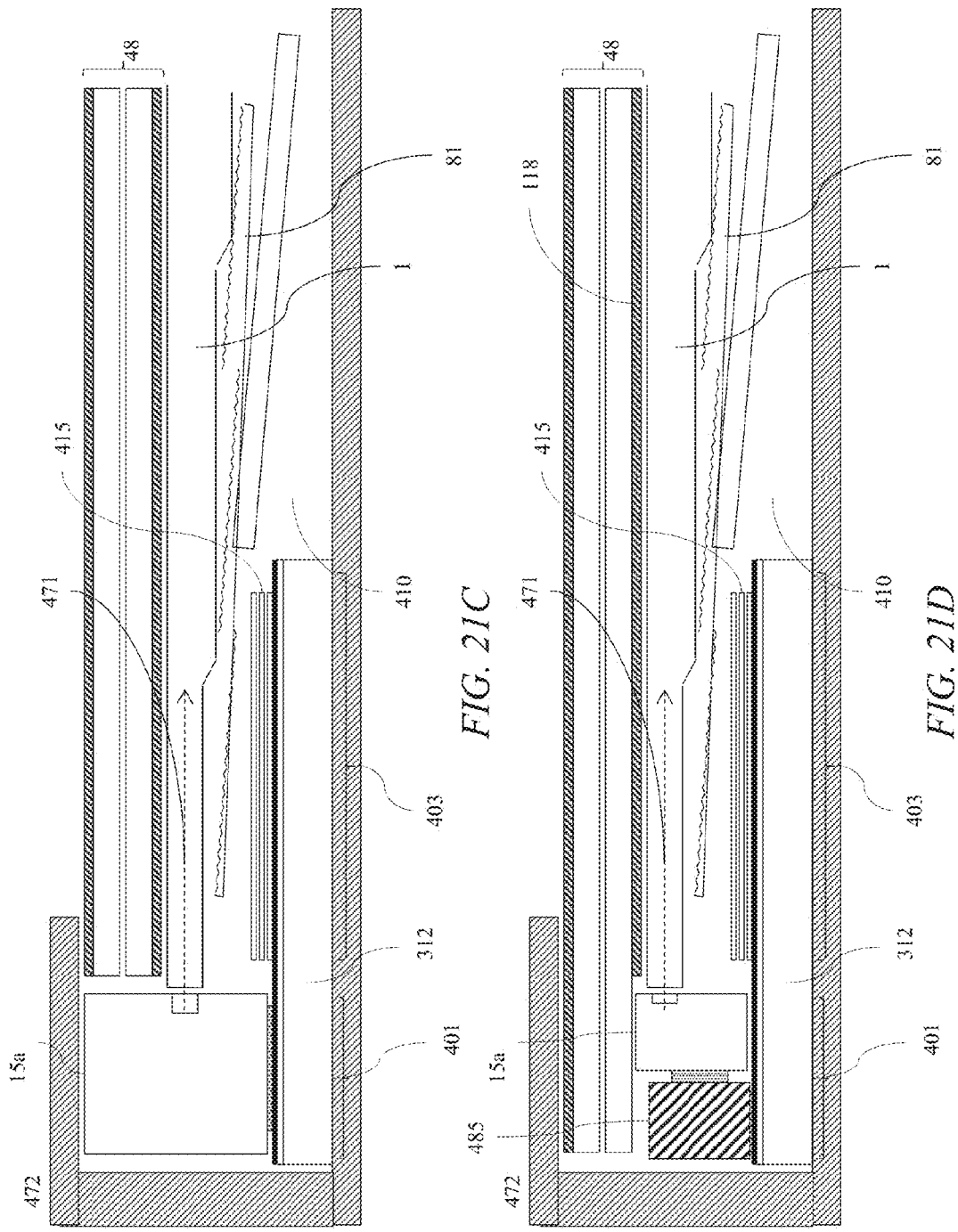

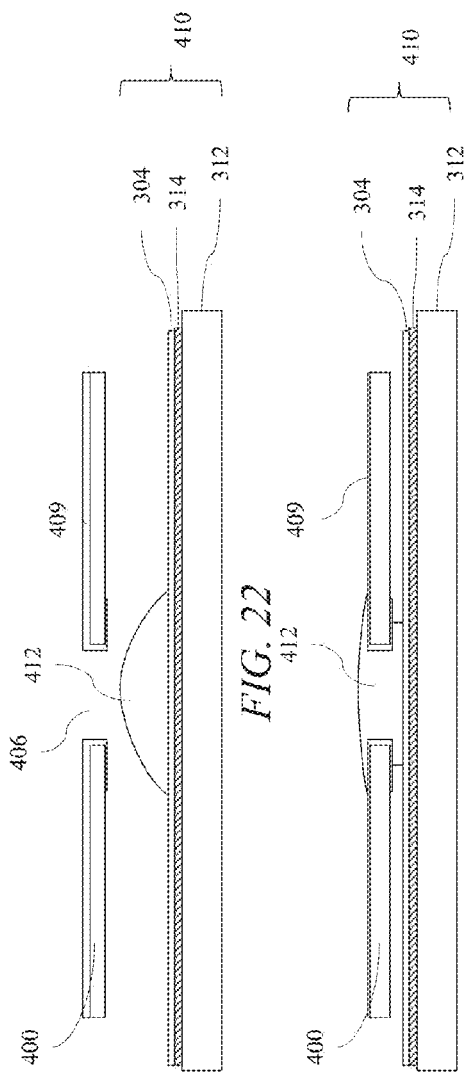
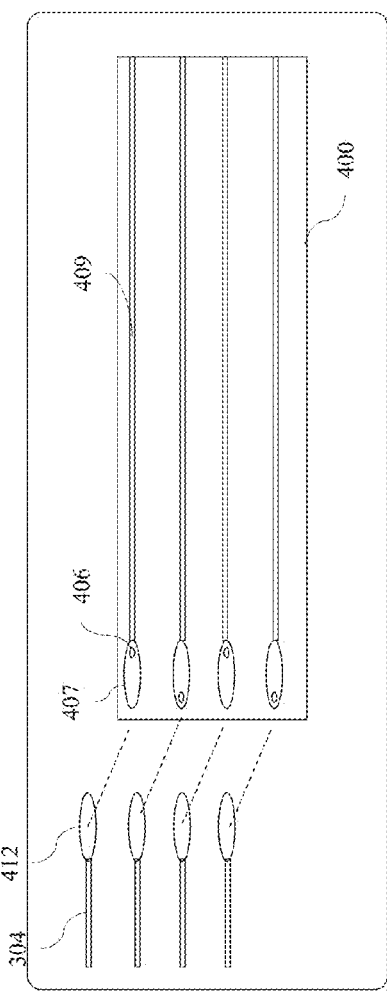
FIG. 22
FIG. 23
FIG. 24

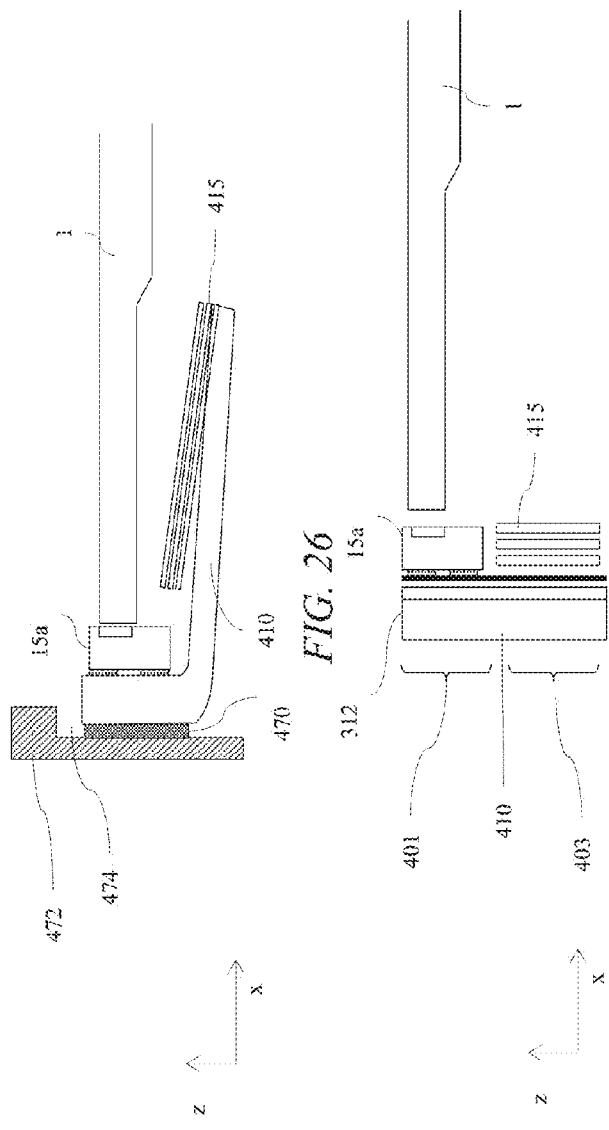
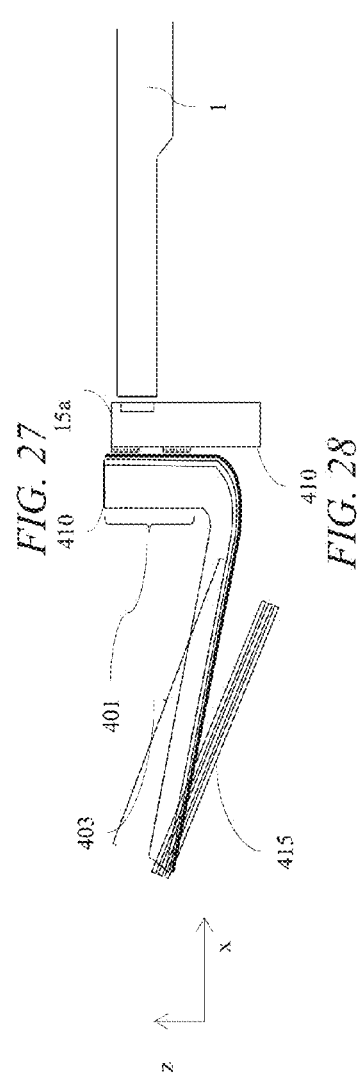
FIG. 26
FIG. 27
FIG. 28

DIRECTIONAL BACKLIGHT

CROSS-REFERENCE TO RELATED APPLICATIONS

This application is related to U.S. patent application Ser. No. 13/300,293, entitled "Directional flat illuminators," filed Nov. 18, 2011, U.S. patent application Ser. No. 14/044,767, entitled "Temporally multiplexed display with landscape and portrait operation modes," filed Oct. 2, 2013, U.S. patent application Ser. No. 14/137,569, entitled "Superlens component for directional display," filed Dec. 20, 2013, U.S. patent application Ser. No. 14/186,862, entitled "Directional backlight," filed Feb. 21, 2014, U.S. patent application Ser. No. 13/897,191, entitled "Control system for a directional light source," filed May 17, 2013, U.S. Provisional Patent Application No. 62/167,203, entitled "Wide angle imaging directional backlights," filed May 27, 2015, all of which are herein incorporated by reference in their entirety. Additionally, this application is related to and claims priority to U.S. Provisional Patent Application No. 62/061,467, entitled "Directional backlight," filed Oct. 8, 2014, which is herein incorporated by reference in its entirety.

TECHNICAL FIELD

This disclosure generally relates to illumination of light modulation devices, and more specifically relates to light guides for providing large area illumination from localized light sources for use in 2D, 3D, and/or autostereoscopic display devices.

BACKGROUND

Backlights for transmissive spatial light modulators typically comprise an array of light sources and optical elements that typically use guiding and extraction of light to distribute light across the area of the spatial light modulator. The light sources may be provided for example by an array of LEDs on at least one side of a light guide plate.

Non-imaging backlights are typically arranged to direct the illumination from multiple light sources through a display panel into a substantially common viewing zone for each of the multiple light sources to achieve wide viewing angle and high display uniformity. Light source arrays for non-imaging backlights may be addressed with substantially the same input for all light sources. Light sources may further be arranged in strings to achieve compact electrical connection apparatus.

In contradistinction, directional backlights may be arranged to direct the illumination from multiple light sources through a display panel into respective different viewing zones, or windows, that are different for each of the multiple light sources, as generally discussed in U.S. patent application Ser. No. 13/300,293, entitled "Directional flat illuminators," filed Nov. 18, 2011 and U.S. patent application Ser. No. 14/186,862, entitled "Directional backlight," filed Feb. 21, 2014, both of which are herein incorporated by reference in their entireties. Directional backlights may achieve additional functionalities compared to non-imaging backlights including high efficiency modes of operation, privacy effect, high luminance for low power consumption and Lambertian operation for user comfort with extended display use. Further, in cooperation with fast update rate spatial light modulators autostereoscopic 3D and low off-axis contrast privacy modes of operation may be achieved.

The control of the mode of operation of directional backlights may be achieved through individual addressing of the light sources of the array of light sources in a manner that forms a desired viewing window structure. For example high efficiency operation may be achieved by addressing a small group of light sources whereas Lambertian operation may be achieved by addressing the whole array uniformly. Further, light may be directed towards an observer by adjusting illumination of light sources in response to measurement of their position.

The present disclosure achieves electrical contact to large arrays of independently light sources in a compact and low cost manner.

BRIEF SUMMARY

According to an aspect of the present disclosure, there may be provided a light source array parallel connection assembly for a directional backlight, the assembly comprising: a mounting strip including an electrical insulator layer extending in a lateral direction, the mounting strip including an end portion and a base portion; an array of light sources mounted to the end portion of the mounting strip arrayed in said lateral direction, and arranged to output light in a forward direction; separate conductive tracks connected to each respective light source formed on the electrical insulator layer of the mounting strip and extending from the end portion onto the base portion; and plural flat connectors, each comprising an array of separate conductive tracks, the flat connectors being mounted in a stack on the base portion of the mounting strip, each conductive track on the mounting strip being electrically connected to a respective conductive track of one of the flat connectors, the flat connectors extending in said lateral direction along the base portion to outside the base portion, allowing electrical connection to be made to the conductive tracks of the flat connectors outside the base portion.

Advantageously a compact connection to a large number of individually addressed light sources may be achieved in comparison to complex electrical connector construction or large connection strip size.

Each conductive track on the mounting strip may be directly electrically connected to a respective conductive track of one of the flat connectors. The mounting strip may further comprise a heat sink layer extending at least across said end portion on the opposite side of the electrical insulator layer from the conductive tracks. The heat sink layer may extend across the end portion and the base portion. The heat sink layer may comprise a layer of metal. The metal may be copper. The assembly may comprise a further heat sink element thermally connected to the heat sink layer adjacent the end portion.

Advantageously high current light sources can be used with desirable heat sinking to maintain device efficiency and lifetime. Such a display may be used in high ambient illumination environments with high image quality without increasing total power consumption.

The assembly may further comprise respective connector blocks connected to each flat connector outside the base portion, which connector blocks may allow electrical connection to be made to the conductive tracks of the flat connectors. The conductive tracks of each flat connector may be exposed outside the base portion to allow electrical connection to be made to them. Advantageously light sources may be placed along the long edge of a display while achieving a narrow bezel between the edge of the active area and edge of the frame. The connector blocks may be placed in a region outside the active area that is along the short edge of a display, and thus physical size is advantageously less constrained.

The end portion may be planar and base portion may be planar. The electrical insulator may be shaped by a linear bend into the end portion and the base portion. Advantageously the electrical connections may be provided with high reliability while the form factor of the strip is conveniently provided to match the display geometry.

The base portion may extend in the forward direction from the light sources. The light sources may be mounted to the mounting strip on a face of the end portion in a top-emitting configuration so that the forward direction is outwardly of the face. The mounting strip may be shaped so the base portion extends in the forward direction.

Advantageously the electrical connection base portion can be folded with respect to the light emitting end portion, and thus can be provided in convenient locations.

The mounting strip may be shaped so that the base portion is disposed on the rearward side of the end portion. The mounting strip may be shaped so that the base portion is disposed on the rearward side of the end portion extending parallel to the end portion. The light sources may be mounted to the mounting strip on a face of the end portion in a side-emitting configuration so that the forward direction is across the face. The base portion may extend in the forward direction. The base portion may extend in the rearward direction.

Advantageously the base portion can be placed under the thin end of an imaging waveguide of a directional backlight. The total thickness of the stack is not increased, achieving a thin structure with a small bezel width. Alternatively the base portion may be arranged outside the area of a spatial light modulator to achieve convenient connection to the array of light sources in a compact form factor.

According to another aspect of the present disclosure there may be provided a directional backlight that may comprise a waveguide comprising an input end for receiving input light and first and second, opposed guide surfaces for guiding input light along the waveguide, wherein the second guide surface is arranged to deflect light guided through the waveguide out of the waveguide through the first guide surface as output light, and the waveguide is arranged to direct the output light into optical windows in output directions that are distributed laterally in dependence on the input position of the input light laterally along the input end; and an assembly according to the first aspect arranged with the light sources disposed at different input positions laterally along the input end of the waveguide, facing the input end of the waveguide for supplying said input light.

According to another aspect of the present disclosure there may be provided a directional display device comprising: a directional backlight according to the second aspect; and a transmissive spatial light modulator comprising an array of pixels arranged to receive the output light from the waveguide and to modulate it to display an image.

According to another aspect of the present disclosure there may be provided a directional display apparatus comprising: a directional display device according to the third aspect; and a control system connected to the flat connectors outside the base portion for providing connection to the light sources, the control system being arranged to control the light sources to direct light into optical windows for viewing by an observer.

Advantageously directional displays may be provided that achieve operating modes including but not limited to high efficiency, high luminance for outdoors, privacy, autostereoscopic display.

Directional backlights offer control over the illumination emanating from substantially the entire output surface controlled typically through modulation of independent LED light sources arranged at the input aperture side of an optical waveguide. Controlling the emitted light directional distribution can achieve single person viewing for a security function, where the display can only be seen by a single viewer from a limited range of angles; high electrical efficiency, where illumination may be provided over a small angular directional distribution; alternating left and right eye viewing for time sequential stereoscopic and autostereoscopic display; and low cost.

These and other advantages and features of the present disclosure will become apparent to those of ordinary skill in the art upon reading this disclosure in its entirety.

BRIEF DESCRIPTION OF THE DRAWINGS

Embodiments are illustrated by way of example in the accompanying FIGURES, in which like reference numbers indicate similar parts, and in which:

FIG. 3 is a schematic diagram illustrating an electrical arrangement of an LED array for the non-imaging backlight of FIG. 1 comprising multiple LED strings, in accordance with the present disclosure;

FIG. 4 is a schematic diagram illustrating the connections to an LED array for the non-imaging backlight of FIG. 1, in accordance with the present disclosure;

FIG. 5 is a schematic diagram illustrating a side view of the structure of a pair LEDs of an LED array for the non-imaging backlight of FIG. 1, in accordance with the present disclosure;

FIG. 6 is a schematic diagram illustrating in perspective view, the structure of a display device comprising a directional backlight arranged with a spatial light modulator, in accordance with the present disclosure;

FIG. 7 is a schematic diagram illustrating a graph of the variation of display luminance with viewing angle for the directional backlight of FIG. 6 for different light source currents, in accordance with the present disclosure;

FIGS. 16-17 are schematic diagrams illustrating in side and front views of flat connectors for a light source array assembly for a directional backlight, in accordance with the present disclosure;

FIGS. 18A-18B are schematic diagrams illustrating in front and side views a light source array mounting strip for a directional backlight, in accordance with the present disclosure;

FIGS. 20A-20B are schematic diagrams illustrating in side and front views a light source array connection system for a directional backlight, in accordance with the present disclosure;

FIGS. 20C-20D are schematic diagrams illustrating in front views light source array parallel connection assembly for a directional backlight comprising partially overlapping flat connectors, in accordance with the present disclosure;

FIG. 21A is a schematic diagram illustrating in side view a directional display comprising a light source array connection system comprising top emitting LEDs, in accordance with the present disclosure;

FIG. 21B-21D are schematic diagrams illustrating in side views a directional display comprising a light source array connection system comprising side emitting LEDs, in accordance with the present disclosure;

FIGS. 22-23 are schematic diagrams illustrating in side view a method to solder connection cables to a light source array assembly for a directional backlight, in accordance with the present disclosure;

FIG. 24 is a schematic diagram illustrating in front view a method to solder connection cables to a light source array assembly for a directional backlight, in accordance with the present disclosure;

FIGS. 26-31 are schematic diagrams illustrating in side view the arrangement of a light source array assembly and a directional light guide plate in a display assembly, in accordance with the present disclosure.

DETAILED DESCRIPTION

Figures 1, 2:
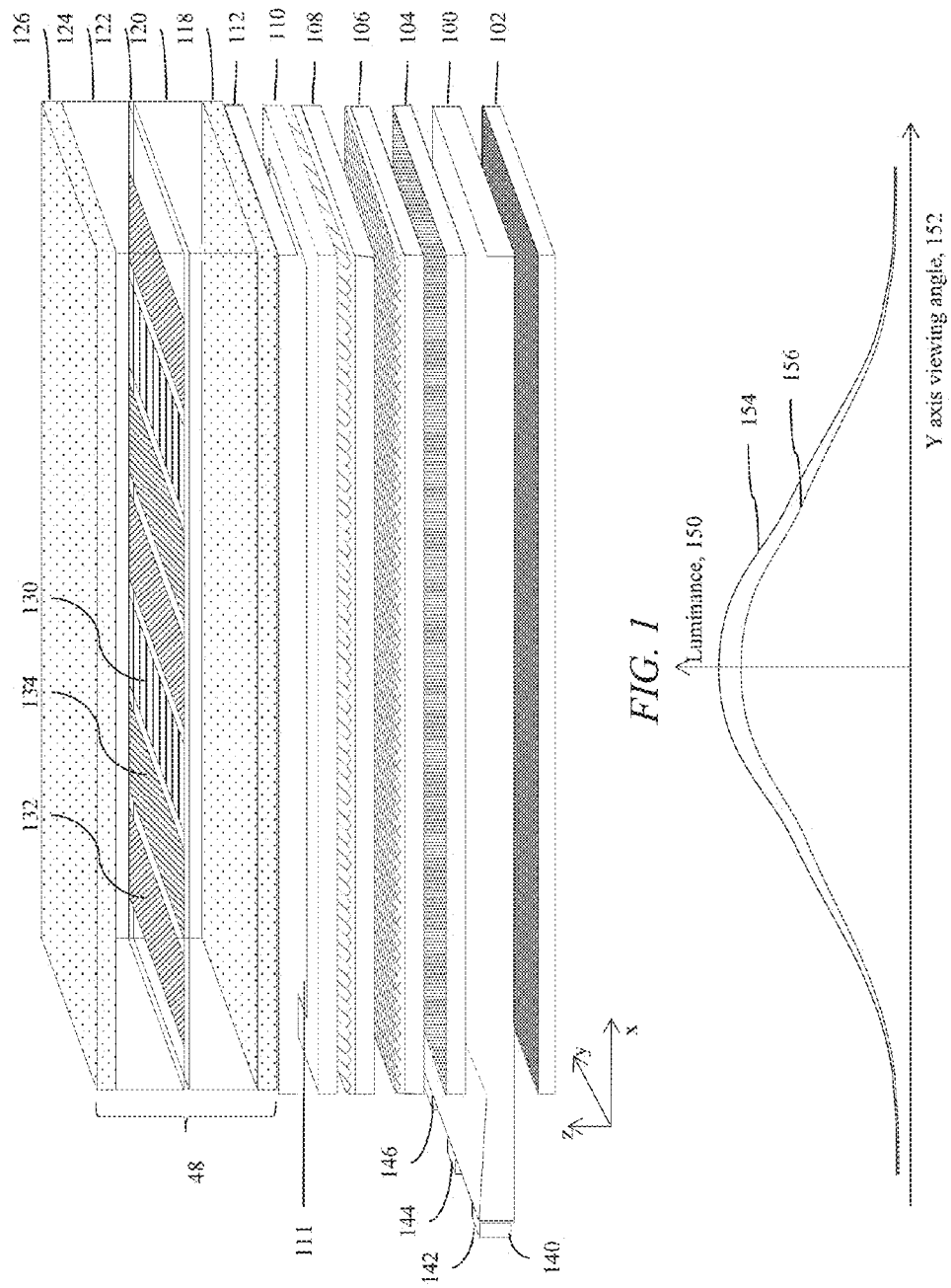
FIG. 1 is a schematic diagram illustrating in perspective view, the structure of a display device comprising a non-imaging backlight arranged with a spatial light modulator, in accordance with the present disclosure.
FIG. 2 is a schematic diagram illustrating a graph of the variation of display luminance with viewing angle for the non-imaging backlight of FIG. 1, in accordance with the present disclosure.

FIG. 1 is a schematic diagram illustrating in perspective view, the structure of a display device comprising a known non-imaging backlight arranged with a spatial light modulator. Light guide plate 100 is arranged to receive light from array 140 of light source 142, 244, 146. Light is extracted from the light guide plate 100 and incident on diffuser 104, prismatic films 106, 108, shading layer comprising aperture region 111 and a further diffuser 112. Rear reflector 102 is arranged to recycle light reflected from the subsequent layers and increase efficiency. Spatial light modulator 48 comprises input polarizer 118, output polarizer 126, substrates 120, 124 with liquid crystal layer 122 comprising red, green and blue image pixels 130, 132, 134.

Conventional non-imaging display backlights as shown in FIG. 1 commonly employ optical waveguides and have edge illumination from light sources such as LEDs. However, it should be appreciated that there are many fundamental differences in the function, design, structure, and operation between such conventional non-imaging display backlights and the imaging directional backlights discussed in the present disclosure.

Non-imaging backlights or light guiding plates (LGPs) are used for illumination of 2D displays. See, e.g., Kälil Käläntär et al., *Backlight Unit With Double Surface Light Emission*, J. Soc. Inf. Display, Vol. 112, Issue 4, pp. 379-387 (December 2004). Non-imaging backlights are typically arranged to direct the illumination from multiple light sources through a display panel into a substantially common viewing zone for each of the multiple light sources to achieve wide viewing angle and high display uniformity. Thus non-imaging backlights do not form viewing windows. In this manner, the light from each of the multiple light sources may be visible for an observer's eye at substantially all positions across the viewing zone. Such conventional non-imaging backlights may have some directionality, for example, to increase screen gain compared to Lambertian illumination, which may be provided by brightness enhancement films such as BEF™ from 3M. However, such directionality may be substantially the same for each of the respective light sources. Thus, for these reasons and others that should be apparent to persons of ordinary skill, conventional non-imaging backlights are different to imaging directional backlights. Edge lit non-imaging backlight illumination structures may be used in liquid crystal display systems such as those seen in 2D Laptops, Monitors and TVs. Light propagates from the edge of a lossy waveguide which may include sparse features; typically local indentations in the surface of the guide which cause light to be lost regardless of the propagation direction of the light.

FIG. 2 is a schematic diagram illustrating a graph of the variation of display luminance 150 with y-axis viewing angle 152 for the non-imaging backlight of FIG. 1. In operation at a first operating, light from LEDs 142, 144, 146 is directed through the light guide plate 100 and respective layers of the non-imaging backlight, in a non-Lambertian distribution as illustrated by luminance distribution 154. If the operating current of LED 142 is reduced or switched off, then new distribution 156 is created, with the luminance distribution reduced in maximum intensity, however the shape of the distribution has substantially the same angular distribution shape. Thus the backlight is a non-imaging type and has substantially a fixed shape angular distribution irrespective of LED drive currents across the array 140.

FIG. 3 is a schematic diagram illustrating an electrical arrangement of an LED array for the non-imaging backlight of FIG. 1 comprising multiple LED strings. Thus the LED array 140 is comprised of multiple LED strings 162 comprising multiple LEDs 166 and connected to input 170 by means of electrodes 164, 168. Thus the number of connections at input 170 may be substantially lower than the number of LEDs in the array 140.

FIG. 4 is a schematic diagram illustrating the connections to an LED array for the non-imaging backlight of FIG. 1. LED assembly 172 may have a small size connection 180 provided by cable 182. Conveniently the height 174 of the assembly may be small due to the small number of connections in the input 170 to the multiple strings 162 of the array 140. Advantageously such an arrangement may be achieved in a compact structure suitable for mobile display devices.

FIG. 5 is a schematic diagram illustrating a side view of the structure of a pair LEDs of an LED array for the non-imaging backlight of FIG. 1. Assembly 172 may comprise a substrate 200 and may further comprise an insulator layer 202. Electrodes 164, 168 may be formed on the insulator 202 and used to provide connection to a string of LEDs 166.

FIG. 6 is a schematic diagram illustrating in perspective view, the structure of a display device comprising an imaging directional backlight arranged with a spatial light modulator. The operation of waveguide 1 comprising an optical valve will be described below with reference to FIGS. 8 and 9. Light source array 15 may comprise LEDs 15a-n arranged at input side 2 of waveguide 1. Rear reflector 81 with reflective structure 83 is arranged to receive light transmitted through features 12 of the waveguide 1. Planar features 10 are arranged between features 12 of the waveguide 1. Optical stack 254 may comprise diffuser, retarder and reflective polarizer elements.

FIG. 7 is a schematic diagram illustrating a graph of the variation of display luminance with viewing angle for the directional backlight of FIG. 6 for different light source currents. In operation, light from each LED 15a-n of array 15 is directed with a different angular distribution in the y-axis. Control of LEDs can achieve a lateral angular shift from distribution 260 to distribution 262. Advantageously the output angular distributions can be controlled to achieve at least power reduction, privacy operation, high luminance outdoors operation, and/or autostereoscopic operation.

Optical valves as described in commonly-owned U.S. patent application Ser. No. 13/300,293 advantageously can be arranged in combination with fast switching transmissive spatial light modulators to achieve time multiplexed autostereoscopic illumination in a thin package while providing high resolution images with flicker free observer tracking and low levels of cross talk. Described is a one dimensional array of viewing positions, or windows, that can display different images in a first, typically horizontal, direction, but contain the same images when moving in a second, typically vertical, direction.

Generally, for example, in accordance with the present disclosure, imaging directional backlights are arranged to direct the illumination from multiple light sources through a display panel to respective multiple viewing windows in at least one axis. Each viewing window is substantially formed as an image in at least one axis of a light source by the imaging system of the imaging directional backlight. An imaging system may be formed between multiple light sources and the respective window images. In this manner, the light from each of the multiple light sources is substantially not visible for an observer's eye outside of the respective viewing window.

As used herein, an optical valve is an optical structure that may be a type of light guiding structure or device referred to as, for example, a light valve, an optical valve directional backlight, and a valve directional backlight ("v-DBL"). In the present disclosure, optical valve is different to a spatial light modulator (even though spatial light modulators may be sometimes generally referred to as a "light valve" in the art). One example of an imaging directional backlight is an optical valve that may employ a folded optical system. Light may propagate substantially without loss in one direction through the optical valve, may be incident on an imaging reflector, and may counter-propagate such that the light may be extracted by reflection off tilted light extraction features, and directed to viewing windows as described in patent application Ser. No. 13/300,293, which is herein incorporated by reference in its entirety.

As used herein, examples of an imaging directional backlight include a stepped waveguide imaging directional backlight, a folded imaging directional backlight, a wedge type directional backlight, or an optical valve.

Additionally, as used herein, a stepped waveguide imaging directional backlight may be an optical valve. A stepped waveguide is a waveguide for an imaging directional backlight including a waveguide for guiding light, further including a first light guiding surface; and a second light guiding surface, opposite the first light guiding surface, further including a plurality of light guiding features interspersed with a plurality of extraction features arranged as steps.

Moreover, as used, a folded imaging directional backlight may be at least one of a wedge type directional backlight, or an optical valve.

In operation, light may propagate within an exemplary optical valve in a first direction from an input side to a reflective side and may be transmitted substantially without loss. Light may be reflected at the reflective side and propagates in a second direction substantially opposite the first direction. As the light propagates in the second direction, the light may be incident on light extraction features, which are operable to redirect the light outside the optical valve. Stated differently, the optical valve generally allows light to propagate in the first direction and may allow light to be extracted while propagating in the second direction.

The optical valve may achieve time sequential directional illumination of large display areas. Additionally, optical elements may be employed that are thinner than the back working distance of the optical elements to direct light from macroscopic illuminators to a window plane. Such displays may use an array of light extraction features arranged to extract light counter propagating in a substantially parallel waveguide.

Thin imaging directional backlight implementations for use with LCDs have been proposed and demonstrated by 3M, for example U.S. Pat. No. 7,528,893; by Microsoft, for example U.S. Pat. No. 7,970,246 which may be referred to herein as a "wedge type directional backlight;" by RealD, for example U.S. patent application Ser. No. 13/300,293 which may be referred to herein as an "optical valve" or "optical valve directional backlight," all of which are herein incorporated by reference in their entirety.

The present disclosure provides stepped waveguide imaging directional backlights in which light may reflect back and forth between the internal faces of for example, a stepped waveguide which may include a first side and a first set of features. As the light travels along the length of the stepped waveguide, the light may not substantially change angle of incidence with respect to the first side and first set of surfaces and so may not reach the critical angle of the medium at these internal faces. Light extraction may be advantageously achieved by a second set of surfaces (the step "risers") that are inclined to the first set of surfaces (the step "treads"). Note that the second set of surfaces may not be part of the light guiding operation of the stepped waveguide, but may be arranged to provide light extraction from the structure. By contrast, a wedge type imaging directional backlight may allow light to guide within a wedge profiled waveguide having continuous internal surfaces. The optical valve is thus not a wedge type imaging directional backlight.

Figure 8:
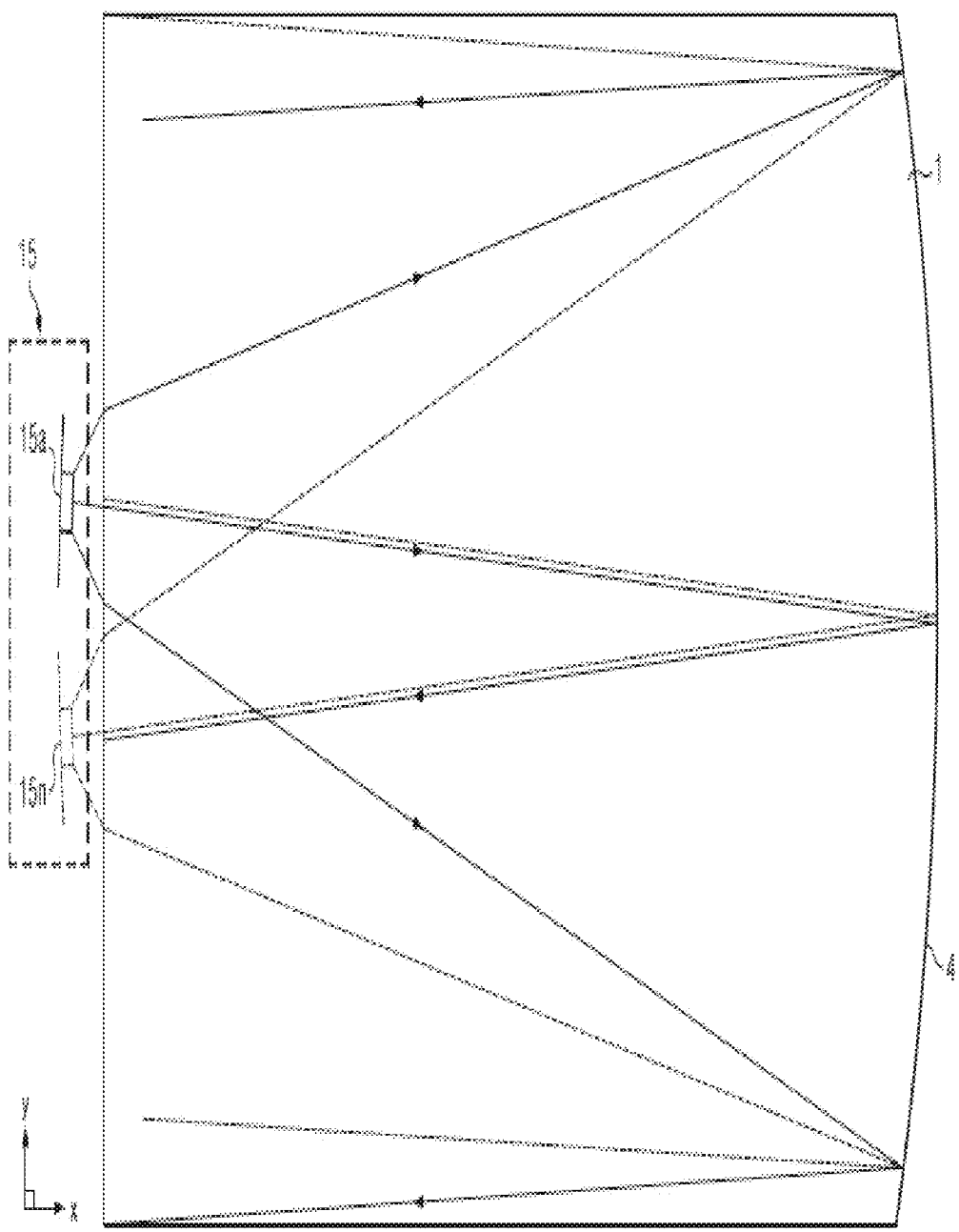
FIGS. 8-9 are schematic diagrams illustrating in front and side views the propagation of light in a directional waveguide similar to that shown in FIG. 6, in accordance with the present disclosure.
Figure 9:
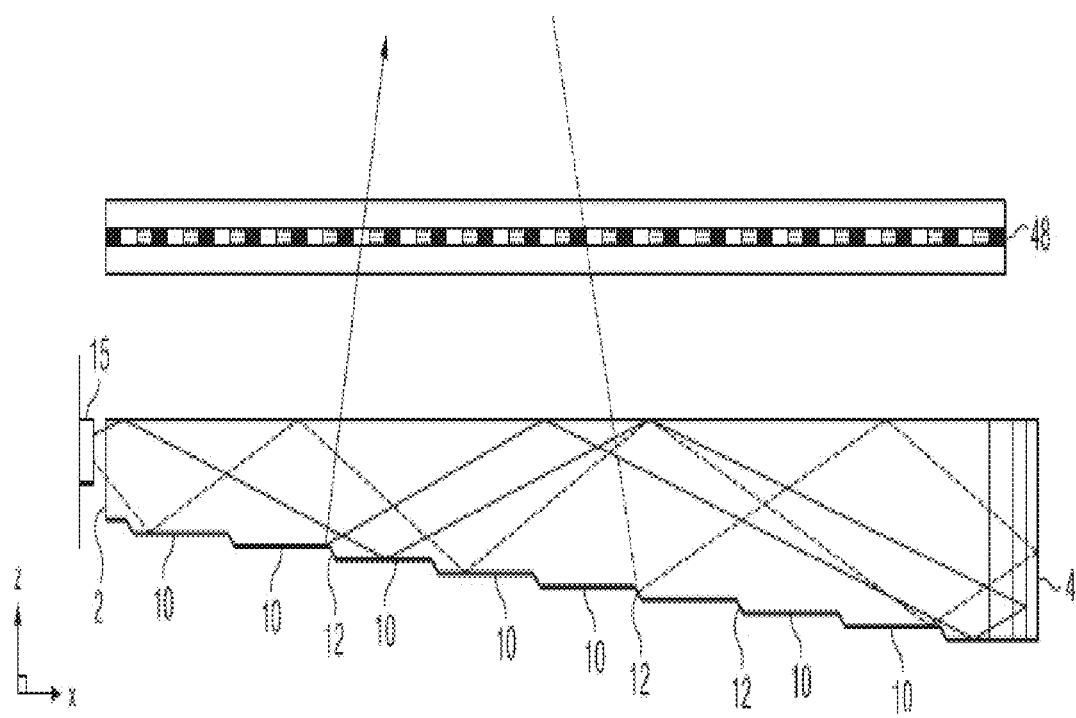

FIGS. 8-9 are schematic diagrams illustrating in front and side views the propagation of light in a directional waveguide similar to that shown in FIG. 6. FIG. 8 is a schematic diagram illustrating a front view of light propagation in one embodiment of a directional display device, and FIG. 9 is a schematic diagram illustrating a side view of tight propagation in the directional display device of FIG. 8.

FIG. 8 illustrates a front view in the xy plane of a directional backlight of a directional display device, and includes an illuminator array 15 which may be used to illuminate a stepped waveguide 1. Illuminator array 15 includes illuminator elements 15a through illuminator element 15n (where n is an integer greater than one). In one example, the stepped waveguide 1 of FIG. 8 may be a stepped, display sized waveguide illumination elements 15a through 15n are light sources that may be light emitting diodes (LEDs). Although LEDs are discussed herein as illuminator elements 15a-15n, other light sources may be used such as, but not limited to, diode sources, semiconductor sources, laser sources, local field emission sources, organic emitter arrays, and so forth. Additionally, FIG. 9 illustrates a side view in the xz plane, and includes illuminator array 15, SLM (spatial light modulator) 48, extraction features 12, guiding features 10, and stepped waveguide 1, arranged as shown. The side view provided in FIG. 9 is an alternative view of the front view shown in FIG. 8. Accordingly, the illuminator array 15 of FIGS. 8 and 9 corresponds to one another and the stepped waveguide of FIGS. 8 and 9 may correspond to one another.

Further, in FIG. 9, the stepped waveguide 1 may have an input end 2 that is thin and a reflective end 4 that is thick. Thus the waveguide 1 extends between the input end 2 that receives input light and the reflective end 4 that reflects the input light back through the waveguide 1. The length of the input end 2 in a lateral direction across the waveguide is greater than the height of the input end 2. The illuminator elements 15a-15n are disposed at different input positions in a lateral direction across the input end 2.

The waveguide 1 has first and second, opposed guide surfaces extending between the input end 2 and the reflective end 4 for guiding light forwards and back along the waveguide 1 by total internal reflection. The first guide surface is planar. The second guide surface has a plurality of light extraction features 12 facing the reflective end 4 and inclined to reflect at least some of the light guided back through the waveguide 1 from the reflective end in directions that break the total internal reflection at the first guide surface and allow output through the first guide surface, for example, upwards in FIG. 9, that is supplied to the SLM 48.

In this example, the light extraction features 12 are reflective facets, although other reflective features could be used. The light extraction features 12 do not guide light through the waveguide, whereas the intermediate regions of the second guide surface intermediate the light extraction features 12 guide light without extracting it. Those regions of the second guide surface are planar and may extend parallel to the first guide surface, or at a relatively low inclination. The light extraction features 12 extend laterally to those regions so that the second guide surface has a stepped shape including of the light extraction features 12 and intermediate regions. The light extraction features 12 are oriented to reflect light from the light sources, after reflection from the reflective end 4, through the first guide surface.

The light extraction features 12 are arranged to direct input light from different input positions in the lateral direction across the input end in different directions relative to the first guide surface that are dependent on the input position. As the illumination elements 15a-15n are arranged at different input positions, the light from respective illumination elements 15a-15n is reflected in those different directions. In this manner, each of the illumination elements 15a-15n directs light into a respective optical window in output directions distributed in the lateral direction in dependence on the input positions. The lateral direction across the input end 2 in which the input positions are distributed corresponds with regard to the output light to a lateral direction, to the normal to the first guide surface. The lateral directions as defined at the input end 2 and with regard to the output light remain parallel in this embodiment where the deflections at the reflective end 4 and the first guide surface are generally orthogonal to the lateral direction. Under the control of a control system, the illuminator elements 15a-15n may be selectively operated to direct light into a selectable optical window. The optical windows may be used individually or in groups as viewing windows.

The reflective end 4 may have positive optical power in the lateral direction across the waveguide. In embodiments in which typically the reflective end 4 has positive optical power, the optical axis may be defined with reference to the shape of the reflective end 4, for example being a line that passes through the center of curvature of the reflective end 4 and coincides with the axis of reflective symmetry of the end 4 about the x-axis. In the case that the reflecting surface 4 is flat, the optical axis may be similarly defined with respect to other components having optical power, for example the light extraction features 12 if they are curved, or the Fresnel lens 62 described below. The optical axis 238 is typically coincident with the mechanical axis of the waveguide 1.

The SLM 48 extends across the waveguide is transmissive and modulates the light passing therethrough. Although the SLM 48 may be a liquid crystal display (LCD) but this is merely by way of example, and other spatial light modulators or displays may be used including LCOS, DLP devices, and so forth, as this illuminator may work in reflection. In this example, the SLM 48 is disposed across the first guide surface of the waveguide and modulates the light output through the first guide surface after reflection from the light extraction features 12.

The operation of a directional display device that may provide a one dimensional array of viewing windows is illustrated in front view in FIG. 8, with its side profile shown in FIG. 9. In operation, in FIGS. 8 and 9, light may be emitted from an illuminator array 15, such as an array of illuminator elements 15a through 15n, located at different positions, y, along the surface of thin end side 2, x=0, of the stepped waveguide 1. The light may propagate along +x in a first direction, within the stepped waveguide 1, while at the same time, the light may fan out in the xy plane and upon reaching the far curved end side 4, may substantially or entirely fill the curved end side 4. While propagating, the light may spread out to a set of angles in the xz plane up to, but not exceeding the critical angle of the guide material. The extraction features 12 that link the guiding features 10 of the bottom side of the stepped waveguide 1 may have a tilt angle greater than the critical angle and hence may be missed by substantially all light propagating along +x in the first direction, ensuring the substantially lossless forward propagation.

Continuing the discussion of FIGS. 8 and 9, the curved end side 4 of the stepped waveguide 1 may be made reflective, typically by being coated with a reflective material such as, for example, silver, although other reflective techniques may be employed. Light may therefore be redirected in a second direction, back down the guide in the direction of −x and may be substantially collimated in the xy or display plane. The angular spread may be substantially preserved in the xz plane about the principal propagation direction, which may allow light to hit the riser edges and reflect out of the guide. In an embodiment with approximately 45 degree tilted extraction features 12, light may be effectively directed approximately normal to the xy display plane with the xz angular spread substantially maintained relative to the propagation direction. This angular spread may be increased when light exits the stepped waveguide 1 through refraction, but may be decreased somewhat dependent on the reflective properties of the extraction features 12.

In some embodiments with uncoated extraction features 12, reflection may be reduced when total internal reflection (TIR) fails, squeezing the xz angular profile and shifting off normal. However, in other embodiments having silver coated or metallized extraction features, the increased angular spread and central normal direction may be preserved. Continuing the description of the embodiment with silver coated extraction features, in the xz plane, light may exit the stepped waveguide 1 approximately collimated and may be directed off normal in proportion to the y-position of the respective illuminator element 15a-15n in illuminator array 15 from the input edge center. Having independent illuminator elements 15a-15n along the input edge 2 then enables light to exit from the entire first light directing side 6 and propagate at different external angles, as illustrated in FIG. 8.

Figure 10:
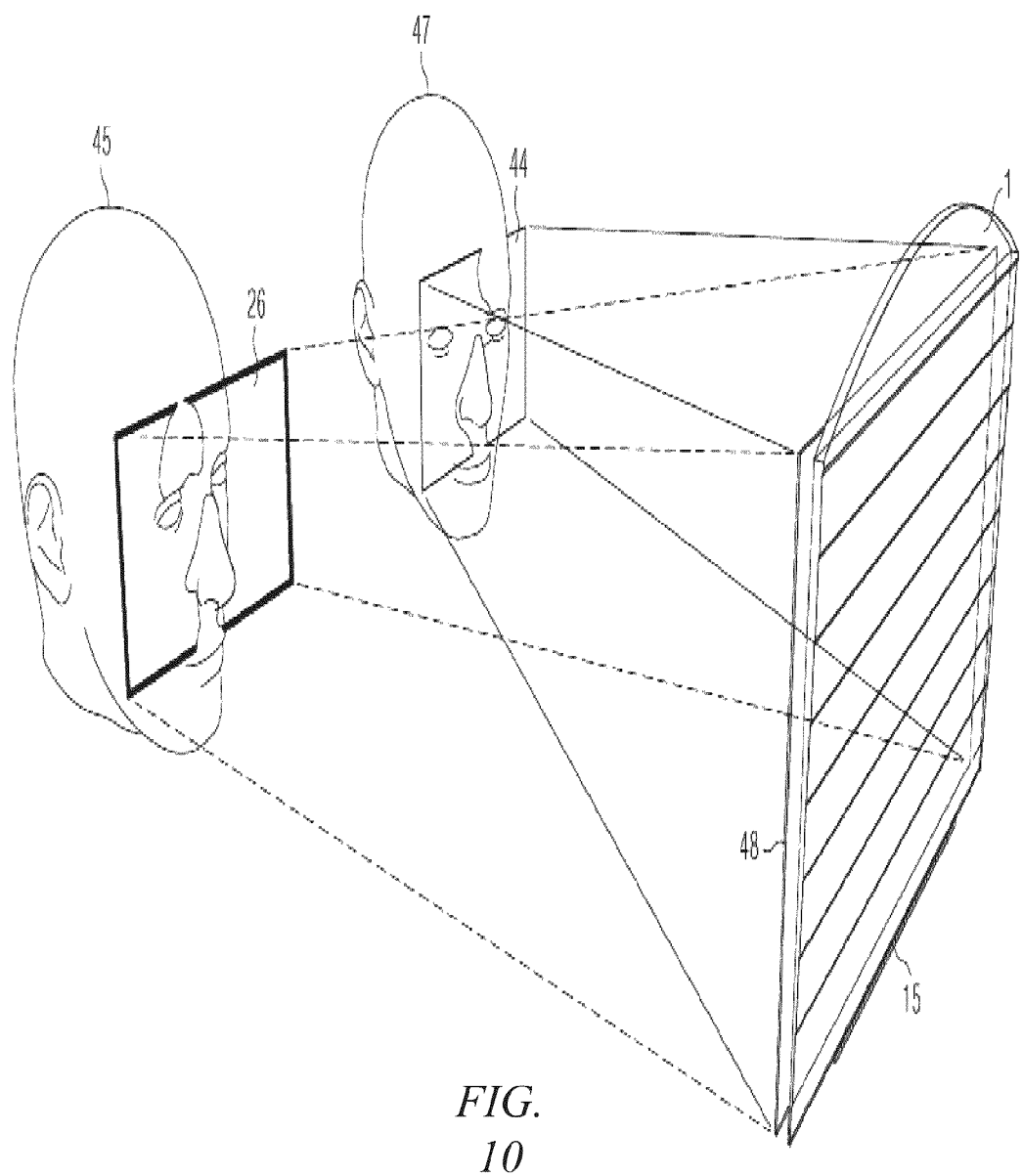
FIG. 10 is a schematic diagram illustrating in perspective view, the control of light from a directional display, in accordance with the present disclosure.

FIG. 10 is a schematic diagram illustrating a privacy directional display device which includes an imaging directional backlight. 2D display systems may also utilize directional backlighting for security and efficiency purposes in which light may be primarily directed at the eyes of a first viewer 45 as shown in FIG. 10. Further, as illustrated in FIG. 10, although first viewer 45 may be able to view an image on device 50, light is not directed towards second viewer 47. Thus second viewer 47 is prevented from viewing an image on device 50. Each of the embodiments of the present disclosure may advantageously provide autostereoscopic, dual image or privacy display functions.

Angular illumination control is advantageously achieved through independent control of LEDs 15a-n of the array 15.

Figure 11:
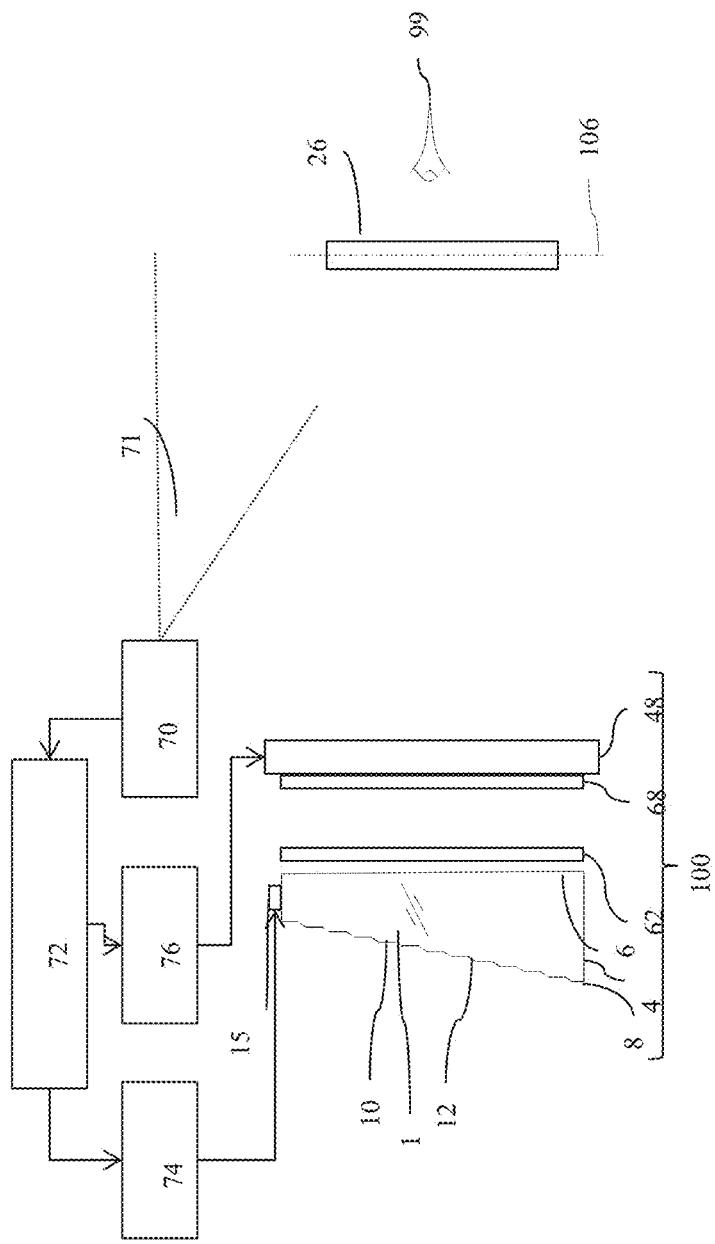
FIG. 11 is a schematic diagram illustrating a control system for a directional display, in accordance with the present disclosure.

FIG. 11 is a schematic diagram illustrating a directional display apparatus comprising a display device and a control system. The display device may comprise a directional backlight comprising waveguide 1, parallax element 100 and spatial light modulator 48 arranged in series. Further touch screen 102 may be arranged in series with the spatial light modulator 48, with the spatial light modulator typically arranged between the touch screen 102 and waveguide. Viewing windows 26 may be provided at window plane 106. Further viewing windows 27 may be produced by light from the waveguide 1 at window plane 107. Viewing windows 27, 26 may be substantially aligned with one another and window planes 106, 107 may be substantially coplanar and superimposed. Spatial light modulator 48 may cooperate with parallax element 100 to produce further viewing windows 29 at window plane 109. As will be described below, the viewing windows 29, 26 may be aligned and may have common window plane 106, 109 locations.

The arrangement and operation of the control system will now be described and may be applied, with changes as necessary, to each of the display devices disclosed herein.

The directional display device comprises a directional backlight that comprises waveguide 1 and an array of illuminator elements 15 arranged as described above. The control system is arranged to selectively operate the illumination elements 15a-15n of the array of illuminator elements 15, to direct light into selectable optical windows, in combination the optical windows providing viewing windows 26.

The control system may comprise a sensor system arranged to detect the position of the observer 99 relative to the display device 100. The sensor system may include a position sensor 70, such as a camera with image capture cone 71 directed towards viewing window 26, and a head position measurement system 72 that may for example comprise a computer vision image processing system. The control system may further comprise an illumination controller 74 and an image controller 76 that are both supplied with the detected position of the observer supplied from the head position measurement system 72.

The illumination controller 74 selectively operates the illuminator elements 15a-15n to direct light to into the viewing windows 26 in cooperation with waveguide 1. The illumination controller 74 selects the illuminator elements 15a-15n to be operated in dependence on the position of the observer detected by the head position measurement system 72, so that the viewing windows 26 into which light is directed are in positions corresponding to the left and right eyes of the observer 99. In this manner, the lateral output directionality of the waveguide 1 corresponds with the observer position.

The image controller 76 controls the SLM 48 to display images. Image controller 76 may be connected to pixel drive element 105 on the spatial light modulator 48 arranged to address the pixels of the spatial light modulator as will be further described below. In one mode of operation, to provide an autostereoscopic display, the image controller 76 and the illumination controller 74 may operate as follows. The image controller 76 controls the SLM 48 to display temporally multiplexed left and right eye images. The illumination controller 74 operate the light sources 15a-15n to direct light into viewing windows in positions corresponding to the left and right eyes of an observer synchronously with the display of left and right eye images. In this manner, an autostereoscopic effect is achieved using a time division multiplexing technique.

The above descriptions may apply to each or all of the following apparatuses, modifications and/or additional features, individually, or any combination thereof, which will now be described.

In another embodiment, a directional display apparatus may further include a control system which may be arranged to selectively operate the light sources to direct light into viewing windows corresponding to output directions as previously discussed. This embodiment may also be used in conjunction with any of the directional backlights, directional display devices, directional display apparatuses, and so forth as described herein.

In another embodiment, a directional display apparatus may be an autostereoscopic display apparatus with a control system. The control system may be further arranged to control the directional display device to temporally display multiplexed left and right images and to substantially synchronously direct the displayed images into viewing windows in positions corresponding to at least the left and right eyes of an observer. The control system may include a sensor system which may be arranged to detect the position of an observer across the display device, and the control system also may be arranged to direct the displayed images into viewing windows in positions corresponding to at least the left and right eyes of an observer. The position of the viewing windows may primarily depend on the detected position of the observer.

Figure 12:
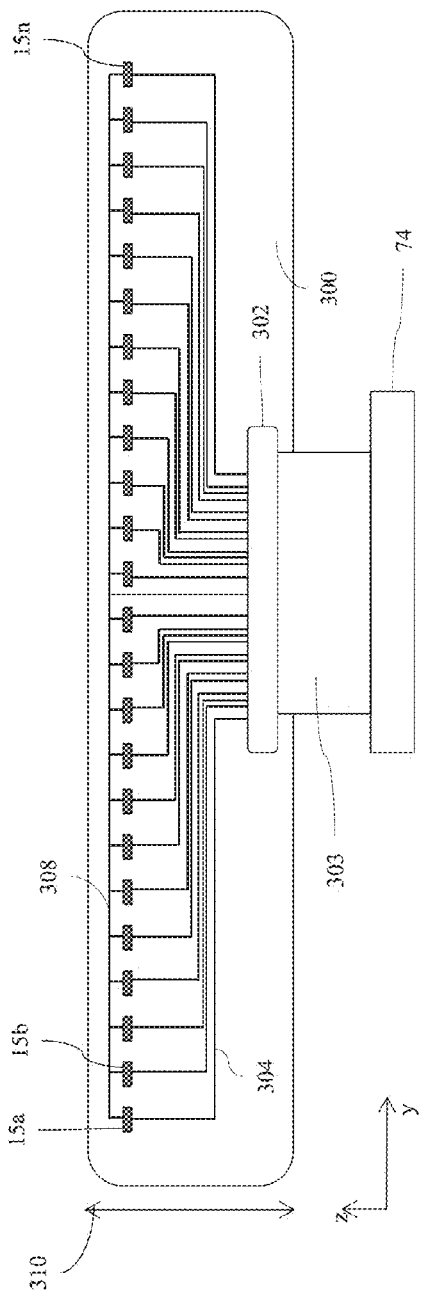
FIG. 12 is a schematic diagram illustrating in front view a light source array assembly for a directional backlight, in accordance with the present disclosure.

FIG. 12 is a schematic diagram illustrating in front view a light source array connection assembly 300 for a directional backlight. As described above, desirably each light source 15a-n of array 15 may be individually addressable. Each light source 15a-n may for example be a single LED or may further comprise multiple light sources such as multi-chip LED packages or strings of packages. The strings of packages may be wired in series to reduce the overall number of electrode tracks 304 however this may reduce the addressability of directional control of light when the light bar is used with a directional light guide plate.

The number of individually addressable light sources 12a-n may be for example at least 8 and more typically between 12 and 48 in a mobile display of diagonal 4", Larger displays may have larger number of individually addressable light sources. For example a 14" display may typically comprise 60 LEDs, or which 12 or more may be in individually addressable strings.

Light source controller 74 supplies current load to the individually addressable light sources 15a-n through cable 303 and connector 302. Electrode tracks 304, 308 are used as input and output electrodes to each of the light sources 15a-n. The fan-out area of the electrode tracks 304 requires height 310 of the connection assembly 300 that disadvantageously increases the display physical volume, undesirably increasing footprint and/or thickness in comparison to the connector size for non-imaging backlights.

Figure 13A:
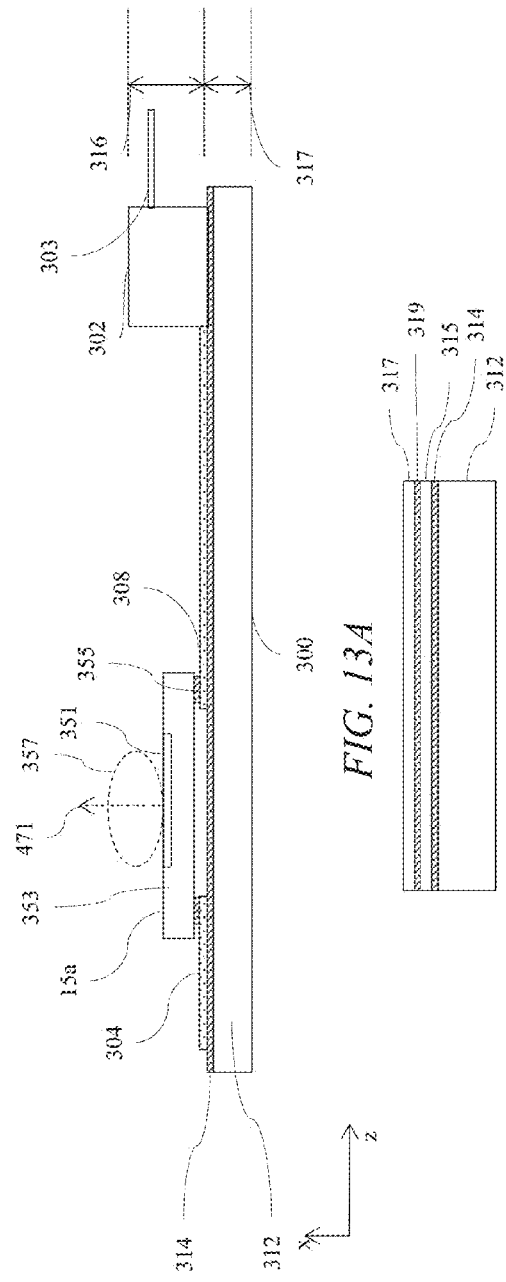
FIG. 13A is a schematic diagram illustrating in side view a light source array assembly for a directional backlight, in accordance with the present disclosure.

FIG. 13A is a schematic diagram illustrating in side views a light source array connection assembly 300 for an imaging directional backlight. Light source 15a may comprise a package 353 comprising electrical connection and heat slug parts; light emitting region 351 that produces a distribution 357 of light with axis 471. In a top emitting LED, the axis 471 may be outwards from the face of the insulator 314, whereas in a side emitting LED, the axis 471 may be parallel to the face of the insulator 314 as will be described herein.

Assembly 300 may comprise a metal core (or clad) printed circuit board (MCPCB) comprising a metal heat sink layer 312, an insulator layer 314 and electrode layer comprising electrode tracks 304, 308. Connector 302 may have a physical height 316 for example 1 mm while MCPCB comprising layers 312, 314 may have height 317 which may be 0.2 mm. The combination of heights 317, 316 disadvantageously increases the display physical volume, undesirably increasing footprint and/or thickness in comparison to the connector size for non-imaging backlights.

In the present embodiments, the package 353 may comprise more than one addressable light source; thus one package may comprise multiple light emitting regions 351. Advantageously fewer package mounting operations may be required during the alignment of the packages to the array on the MCPCB 312, 314, reducing cost.

It may be desirable to increase the surface area of electrical connectivity in thin devices.

Figure 13B:
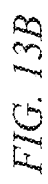
FIG. 13B is a schematic diagram illustrating in side view a dual layer metal core printed circuit board, in accordance with the present disclosure.

FIG. 13B is a schematic diagram illustrating in side view a dual layer metal core printed circuit board that can be used for providing parallel connectivity in limited areas. Conductive layers 315 and 317 may be formed with intermediate additional insulator layer 319. Electrode tracks 304, 308 may be formed by means of forming via holes to layer 315 as well as in layer 317. However such elements are expensive and complicated to remove.

Desirably the connector size for imaging directional backlights should be reduced, preferably with low cost MCPCB construction.

Figure 14:
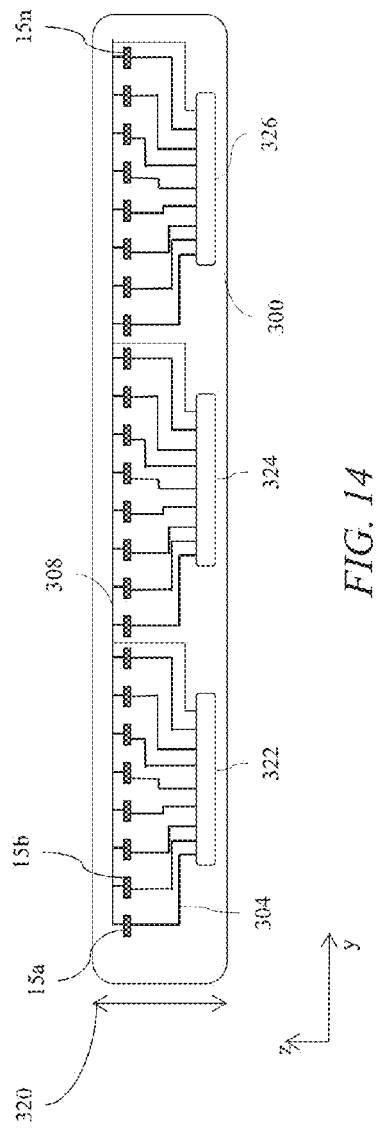
FIGS. 14-15 are schematic diagrams illustrating in front view light source array assemblies for a directional backlight, in accordance with the present disclosure.
Figure 15:
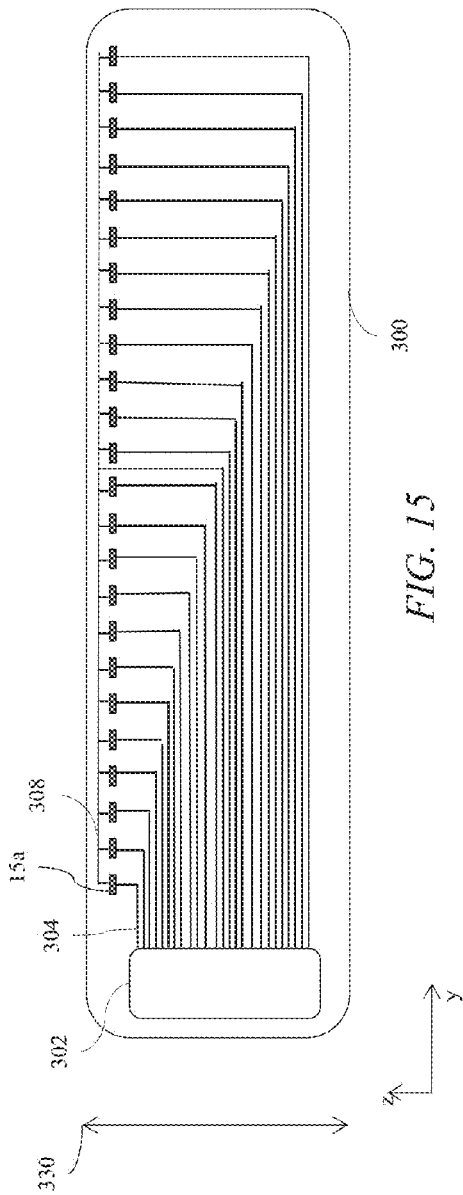

FIGS. 14-15 are schematic diagrams illustrating in front view light source array connection assemblies for a directional backlight. In FIG. 14 multiple connectors 322, 324, 326 may be introduced, thus reducing height 320 in comparison to height 310 in FIG. 12. Connector height 316 remains in the region near to the LEDs, that can increase display thickness or footprint area. Typically there is some allowable space outside the panel footprint in the system design.

It may be desirable to route connectors from the side of the array, so outside the active area of the spatial light modulator 48, in a similar manner to the connector 180, 182 in FIG. 4, FIG. 15 shows that the tracks 304 can have a 90 degree bend, providing a side location for connector 302, however the height 330 of connection assembly 300, which is typically an MCPCB, is substantially increased and cost increased.

It may be desirable to provide a connection assembly for an array 15 of individually addressable light sources 15 a-n, with low footprint area and thickness, suitable for dense connectivity in a mobile display platform with small volume and reduced cost.

FIGS. 16-17 are schematic diagrams illustrating in side and front views of flat connectors for a light source array parallel connection assembly for a directional backlight. Plural flat connectors 400, 402, 404 each comprise an array of separate conductive tracks 409. In operation, the flat connectors 400, 402, 404 are mounted in a stack 415. Each connector may further comprise connection regions 406, that may comprise holes with connection to conductive tracks 409. Flat connectors 400, 402, 404 may have thickness of 100 microns for example. The length of each flat connector may be different. The flat connectors 400, 402, 404 may be Flat Flexible Cable (FFC's) that are made up of thin rectangular copper conductors laminated between two layers of polyester insulation for example. Alternatively the flat connectors may be Flexible Printed Circuits (FPC's) that are similar in construction to FFC's except that copper film is chemically etched to produce the desired electrode pattern.

FIGS. 18A-18B are schematic diagrams illustrating in front and side views a light source array mounting strip 410 for a directional backlight. The mounting strip 410 includes an electrical insulator layer 314 extending in a lateral direction (y direction) and shaped into: an end portion 401 having a face; and a base 403 portion extending from the face of the end portion 401. Line 405 may be provided about which the end and base portions 403, 401 are shaped. The mounting strip may be provided with multiple regions 414, 416, 418 of light sources 15a-n of the array 15 that are connected by means of electrical tracks 304, 308 to respective connection regions 421, 417, 419 comprising connector features 412. The mounting strip 410 thus further comprises a heat sink layer 312 extending at least across said end portion 401 on the opposite side of the electrical insulator layer 314 from the conductive tracks 304 and the heat sink layer 312 may comprise a layer of metal that may be copper or aluminium for example. The heat sink layer 312 may further extend across the end portion 401 and the base portion 403.

Figure 18C:
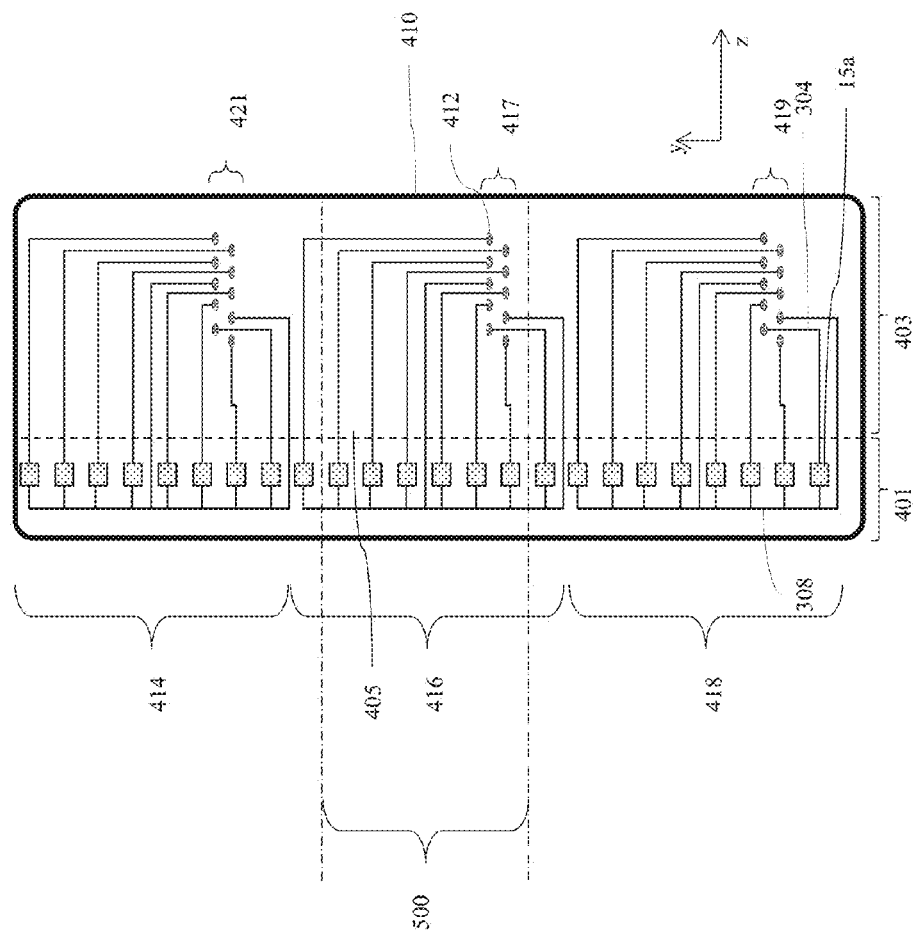
FIG. 18C is a schematic diagram illustrating in front view a light source array mounting strip for a directional backlight, in accordance with the present disclosure.

FIG. 18C is a schematic diagram illustrating in front view a light source array mounting strip 410 fora directional backlight. In this example regions 401 and optionally region 403 may be colored with a colored overcoat for example a solder mask layer that is for example black or white. Black solder mask can reduce the back reflections from the bar and improve the leakage of light from the intended direction. Conversely a white overcoat or solder mask layer can advantageously improve the overall brightness of the display. The color overcoat may optionally be applied in a region 500 which may not align with the electrical grouping of the electrodes (as illustrated) and is chosen for optical performance reasons. In particular the region 500 may be one color for example white and the region of the bar outside region 500 may be a different color for example black. Advantageously the brightness of the display may be improved in the central position and the leakage of light from the intended directions may be reduced.

Figure 19:
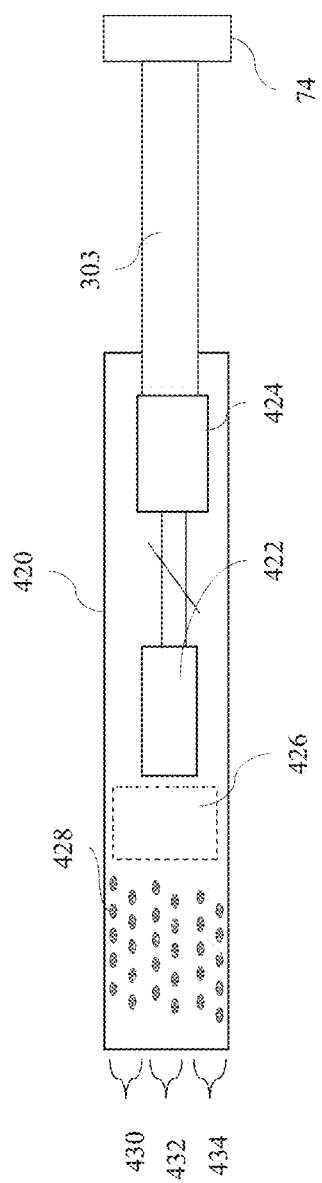
FIG. 19 is a schematic diagram illustrating in front view an interface connector assembly for a directional backlight, in accordance with the present disclosure.

FIG. 19 is a schematic diagram illustrating in front view an interface connector assembly 420 for a directional backlight light source array. Assembly 420 may comprise a PCB with connector features 428 in blocks 430, 432, 434. Connector 303 connected to control system 74 by means of connector 424 may be arranged to address LED current control element 422. Element 422 may be used to provide individually controllable constant current values for the output of each light source 15a-n in response to control signals from control system 74. In an illustrative example, element 422 may comprise one or more chips such as the iW7032 manufactured by Dialog Semiconductor. Fan out track region 426 may be provided to connect features 428 to element 422.

FIGS. 20A-20B are schematic diagrams illustrating in side and front views a light source array parallel connection assembly for a directional backlight. The arrangement comprises a mounting strip 410 including an electrical insulator layer 314 extending in a lateral direction, such as the y direction, which may be shaped into an end portion 401 having a face; and a base portion 403 extending from the face of the end portion. An array of light sources 15a-n is mounted to the face of the end portion 401 of the mounting strip 410 arrayed in said lateral direction, and arranged to output light outwardly from said face.

Separate conductive tracks 304 are connected to each respective light source 15a-n formed on the electrical insulator layer 314 of the mounting strip 410 and extending across the end portion 401 and onto the base portion 403.

The plural flat connectors 400, 402, 404 each comprising an array of separate conductive tracks 409, are mounted in a stack 415 on the base portion of the mounting strip 410, each conductive track 304 on the mounting strip 410 being electrically connected to a respective conductive track 409 of one of the flat connectors 400, 402, 404, the flat connectors 400, 402, 404 extending in said lateral direction along the base portion to at least one region 429 outside the base portion 403, allowing electrical connection to be made to the conductive tracks 409 of the flat connectors 400, 402, 404 outside the base portion. The array of light sources 15a-n may also be provided with one or more common electrodes 308.

During assembly, the flat connector 404 may be mounted on the base portion 403 followed by the flat connector 402 and finally the flat connector 400. The number of flat connectors may be two or more.

Each conductive track 304, 308 on the mounting strip is directly electrically connected to a respective conductive track 409 of one of the flat connectors 400, 402, 404. Connector blocks 430, 432, 434 are connected to each flat connector 400, 402, 404 outside the base portion 403, which connector blocks 430, 432, 434 allow electrical connection to be made to the conductive tracks 409 of the flat connectors 400, 402, 404. The conductive tracks 409 of each flat connector 400, 402, 404 are exposed outside the base portion 403 to allow electrical connection to be made to them.

Thus a light source array parallel connection assembly for a directional backlight may comprise a mounting strip 410 including an electrical insulator layer 314 extending in a lateral direction, the mounting strip 410 including an end portion 401 and a base portion 403. An array of light sources 15a-n may be mounted to the end portion 401 of the mounting strip 410 arrayed in said lateral direction, and arranged to output light in a forward direction. Separate conductive tracks 304 may be connected to each respective light source 15a-n formed on the electrical insulator layer 314 of the mounting strip 410 and extending from the end portion 401 onto the base portion 403.

Further there may be provided Plural flat connectors 400, 402, 404, each comprising an array of separate conductive tracks 409, the flat connectors 400, 402, 404 being mounted in a stack 415 on the base portion 403 of the mounting strip 410, each conductive track 304 on the mounting strip being electrically connected to a respective conductive track 309 of one of the flat connectors 400, 402, 404. The flat connectors 400, 402, 404 may extending in said lateral direction along the base portion 403 to outside the base portion, allowing electrical connection to be made to the conductive tracks 409 of the flat connectors 400, 402, 404 outside the base portion.

Each conductive track on the mounting strip 410 may be directly electrically connected to a respective conductive track 409 of one of the flat connectors. The mounting strip 410 may thither comprise a heat sink layer 312 extending at least across said end portion 403 on the opposite side of the electrical insulator layer 314 from the conductive tracks 304. The heat sink layer 312 may extend across the end portion 401 and the base portion 403 and may comprise a layer of metal that may be copper or aluminum.

Advantageously the width of the mounting strip can be minimized. Further, as the number of light sources is increased, the width of mounting strip can be maintained by increasing the number of flat connectors.

Further, the interface connector assembly 420 may be arranged along the short edge of the SLM 48 while the light sources are arranged along the long edge. Advantageously high efficiency illumination can be achieved in a compact package.

It may be desirable to reduce the total number of connections to the light sources of the array. It may be further desirable to reduce the total thickness of the stack of flat connectors.

FIGS. 20C-20D are schematic diagrams illustrating in front views light source array parallel connection assembly for a directional backlight comprising partially overlapping flat connectors. FIG. 20C illustrates a pair of flat connectors 400, 402 and FIG. 20D illustrates the arrangement of flat connectors 400, 402 when connected to the mounting strip 410. Mounting strip 400 may have two regions 481, 483 with first and second lengths arranged to connect to connection regions 421, 419. Mounting strip may be arranged to connect to region 417. Advantageously the total thickness of the stack 415 of flat connectors 400, 402 may be reduced.

Further, the outer light sources of the array 15a-n connected to regions 419, 421 may be provided for example as strings of multiple LEDs. The inner light sources connected to region 417 may be provided as either individually addressable LEDs or strings with fewer LEDs than those connected to the outer regions. Thus the number of connections provided may be reduced. Advantageously, the outer light sources may be required to have lower current drive characteristics compared to the inner light sources. Thus, more LEDs may be connected in series, reducing the number of connections. Further, the number of flat connectors may be reduced, reducing total device thickness.

It may be desirable to further reduce the volume that is occupied by the light source array connection assembly.

FIGS. 21A-21C are schematic diagrams illustrating in side views a directional display comprising a light source array connection system comprising top and side emitting LEDs respectively. The thickness of the input side 2 of the waveguide 1 is thinner than the end 4 comprising a mirror. Desirably, the additional space available can be used for placement of the base portion 403 of the mounting strip 410.

FIGS. 21A-C show arrangements wherein the base portion 403 extends in the forward direction from the light sources 15*a-n*. The light sources 15*a-n* are mounted to the mounting strip 410 on a face of the end portion 401 in a top-emitting configuration so that the forward direction is outwardly of the face. The mounting strip 410 is shaped so the base portion 403 extends in the forward direction.

In FIG. 21A light source of the array 15*a-n* comprises a top emitting LED, that is light rays are emitted in a cone with an axis 471 directed outwardly from the face of the end portion 401. The strip 410 is shaped so that in the region of the line 405, the electrical insulator 314 is shaped by a bend that may be linear into the end portion 401 and the base portion 403. The base portion 403 extends forwards of the face of the end portion 401. The base portion 403 and flat connector stack 415 is thus arranged under the rear reflector 81 and waveguide 1. A further rear bezel 473 that provides mechanical stability for the display apparatus may be arranged between the flat connector stack 415 and optical elements 1, 81, 48.

The strip 405 may be connected to the frame 472 of the display device by means of a thermally conductive layer 470 to provide for mechanical stability and heat sinking of the light sources through to the frame during operation. Advantageously the junction temperature of the LED may be reduced, increasing efficiency.

Advantageously a thin stack can be achieved with multiple individually addressable light sources 15*a-n*.

Thus directional backlight comprising a waveguide 1 comprising an input end 2 for receiving input light and first and second, opposed guide surfaces 6,8 for guiding input light along the waveguide 1, wherein the second guide surface 8 is arranged to deflect light guided through the waveguide 1 out of the waveguide 1 through the first guide surface 6 as output light, and the waveguide 1 is arranged to direct the output light into optical windows 26 in output directions that are distributed laterally in dependence on the input position of the input light laterally along the input end 2; and a connection assembly as described herein arranged with the light sources 15*a-n* disposed at different input positions laterally along the input end 2 of the waveguide 1, facing the input end 2 of the waveguide 1 for supplying said input light.

A directional display device may comprise said directional backlight and a transmissive spatial light modulator 48 comprising an array of pixels 130, 132, 134 arranged to receive the output light from the waveguide 1 and to modulate it to display an image. A directional display apparatus may comprise said directional display device and a control system 74 connected to the flat connectors 400, 402, 404 outside the base portion 403 for providing connection to the light sources 15*a-n*, the control system being arranged to control the light sources 15*a-n* to direct light into optical windows 26 for viewing by an observer 99.

Advantageously a directional display can achieve addressable directionality in a compact package.

It may be further desirable to reduce bezel width; that is the distance 475 between the edge of the pixels 130, 132, 134 of the active area and the outer edge of the frame 472 for the device.

FIG. 21B shows an arrangement wherein the base portion 403 extends outwardly of the end portion 401. The base portion 403 extends in the forward direction. Light source 15*a* comprises a side emitting LED, that is light rays are emitted in a cone with axis 471 parallel to the face of the end portion 401 into the end 2 of the waveguide 1. In the region of line 405, the strip 410 is shaped so that the base portion 403 is rearwards with respect to the face portion 401. The light sources 15*a-n* are thus mounted to the mounting strip 410 on a face of the end portion 401 in a side-emitting configuration so that the forward direction is across the face.

Advantageously the heat sink layer 312 is not positioned between the light source and the outer frame, reducing bezel width 477.

The apparatus may further comprise a further heat sink element thermally connected to the heat sink layer 312 adjacent the end portion 403. Thus heat sink layer 312 of the strip 410 may be further thermally connected to the rear bezel 473, advantageously improving heat sink performance and reducing LED junction temperature, increasing efficiency.

FIG. 21C shows a further embodiment wherein the end portion and base portion are co-planar. The light sources 15*a-n* are mounted to the mounting strip 410 on a face of the end portion 401 in a side-emitting configuration so that the forward direction is across the face. The base portion 403 extends in the forward direction. Advantageously the heat sink layer 312 is not distorted and an increased thickness and stiffer material can be used. Further, the heat sink layer 312 may be bonded to the frame 472, increasing thermal heat sinking capability.

FIG. 21D shows a further embodiment wherein an additional electrically and thermally conductive element 485 is arranged between the light source 15*a* and MCPCB 312; advantageously the light source 15*a* may be provided by a top emitting LED of simpler construction than the side emitting LED of FIG. 21C.

Further, light source 15*a* may have an emitting region 351 that is offset from the center of the package 353. Further polarizer 118 may be trimmed to enable the light source to extend above the emitting region, conveniently achieving a larger surround for the light source. Advantageously a compact arrangement of light sources with respect to the spatial light modulator may be achieved.

FIGS. 22-23 are schematic diagrams illustrating in side view a method to solder connection cables to a light source array assembly for a directional backlight. In a first step as shown in FIG. 22, the flat connector 400 comprising holes 406 and electrode tracks 409 are aligned with features 412 that comprise solder regions on electrode tracks 304, 308. After heating and contact, a solder plug or "rivet" as shown in FIG. 23 is formed that advantageously provides both mechanical and electrical connection in a low profile between the MCPCB of the strip 410 and flat connector 400.

It may be desirable to further increase the mechanical ruggedness of the joint between the flat connector 400 and strip 410.

FIG. 24 is a schematic diagram illustrating in front view a method to solder connection cables to a light source array assembly for a directional backlight. The tracks 304, 409 may respectively have bond regions 412, 407 that are elongate and holes 406 are offset between adjacent tracks 409. In this manner, the strength of the bond seam can advantageously be increased.

Desirably, the connection to the interface connector assembly should be removable.

Figure 25:
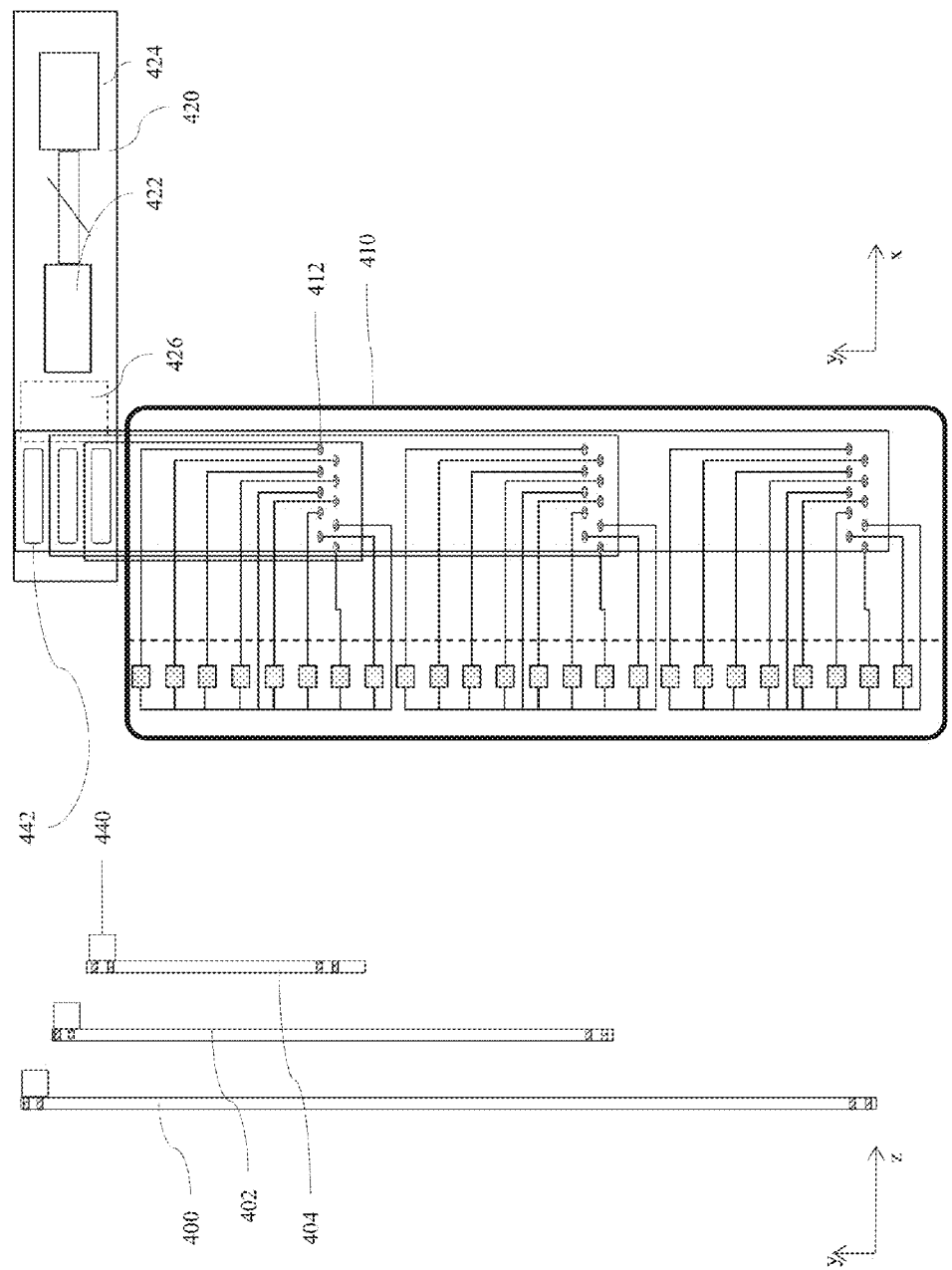
FIGS. 25A-25B are schematic diagrams illustrating in side and front views a light source array connection system for a directional backlight, in accordance with the present disclosure.

FIGS. 25A-25B are schematic diagrams illustrating in side and front views a light source array connection system for a directional backlight. FIG. 20B illustrates the use of solder plug method of FIGS. 22-23. By way of comparison, FIGS. 25A-B show flat connectors 400, 402, 404 with connectors 440 so that removable connection can be provided for attachment to interface connector assembly 420 by means of mating connectors 442.

FIGS. 26-31 are schematic diagrams illustrating in side view the arrangement of a light source array assembly and a directional light guide plate in a display assembly. In FIGS. 26-29 the light sources 15a-n are mounted to the mounting strip 410 on a face of the end portion 401 in a top-emitting configuration so that the forward direction is outwardly of the face.

FIG. 26 shows an arrangement wherein the base portion 403 extends in the forward direction from the light sources 15a-n. Further the mounting strip 410 is shaped so the base portion 403 extends in the forward direction. FIG. 26 illustrates a side frame 472 with recess 474, arranged to advantageously reduce bezel width 475 in comparison to the arrangement of FIG. 21A.

FIG. 27 illustrates a strip 410 comprising coplanar end portion 401 and base portion 403 with a vertical orientation with respect to the waveguide 1. Advantageously the thickness of the heat sink layer 312 may be increased.

Figure 29:
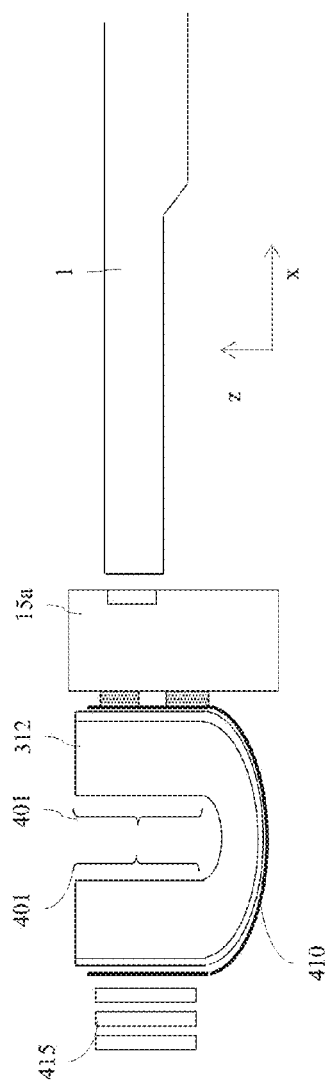

FIGS. 28-29 illustrate strip 410 with various degrees of reverse bends so that the base portion 403 is extended rearwards with respect to the end portion 401. The mounting strip 410 is shaped on that the base portion 403 is disposed on the rearward side of the end portion 401. Advantageously the flat connectors are stacked away from the waveguide 1, reducing complexity of assembly for systems with sufficient assembly space outside the active area of the spatial light modulator 48. In FIG. 29 the mounting strip 410 is shaped so that the base portion is disposed on the rearward side of the end portion extending parallel to the end portion 401. Advantageously, the extent of the rearward facing base region 403 is reduced.

Figure 30:
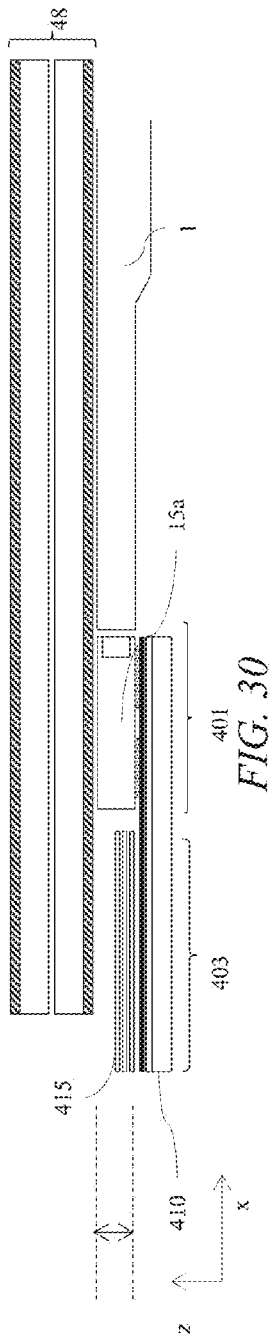
Figure 31:
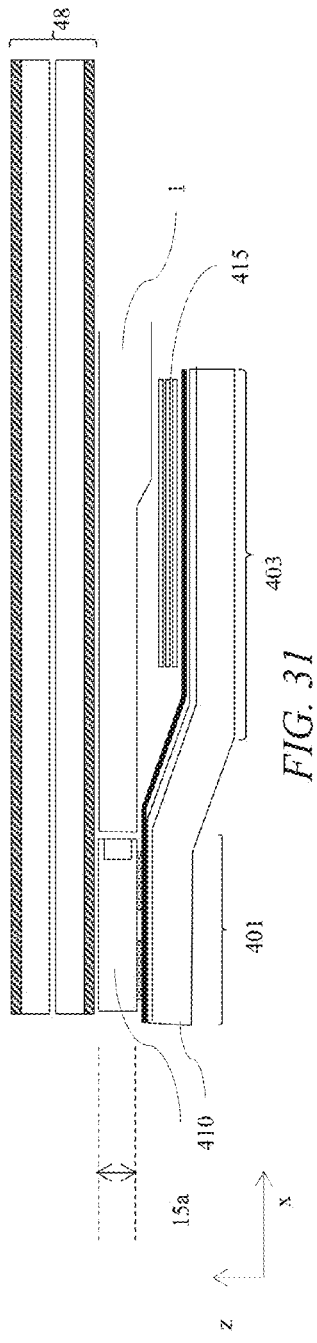

FIGS. 30-31 illustrate arrangements where the spatial light modulator overlays the array 15 of light sources with co-planar and rearwards base regions 403. The light sources 15a-n are mounted to the mounting strip 410 on a face of the end portion 401 in a side-emitting configuration so that the forward direction is across the face.

FIG. 30, the base portion 403 extends in the rearward direction whereas FIG. 31 shows an arrangement wherein the base portion 403 extends in the forward direction from the light sources 15a-n.

Figure 32:
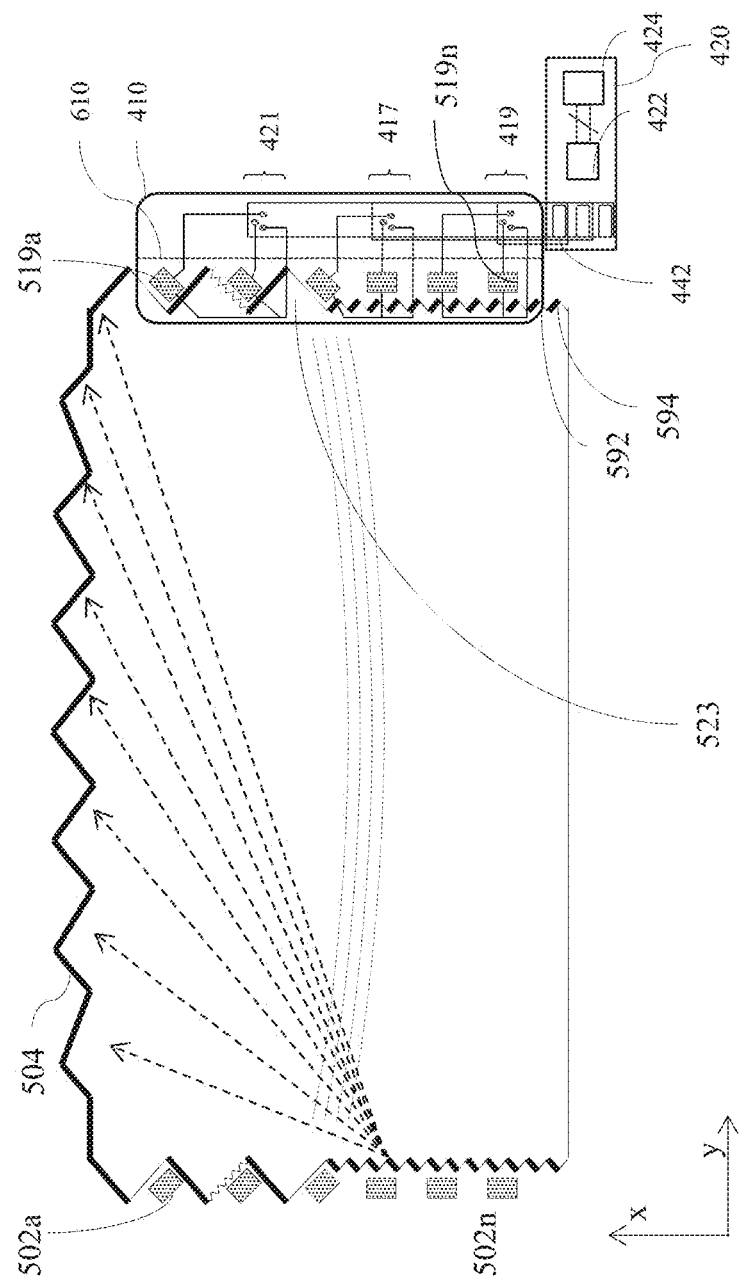
FIG. 32 is a schematic diagram illustrating an arrangement where wherein arrays of light sources may be positioned on a base portion, in accordance with the present disclosure.

FIG. 32 illustrates an example arrangement where arrays of light sources 519a-n may be positioned on a base portion 410. The base portion may be bent out of plane for example along the dotted line 610. FIG. 32 illustrates 6 light sources on each side, however light sources may be on one side only or may comprise different numbers of light sources for example as illustrated in FIG. 20. The connection regions 421, 417, 419 may be positioned to provide connections for flat cables that connect in a stack to connectors 442, similar to those described with reference to FIG. 20. The overlapped connector cables reduce the space occupied by connectors. Connectors 442 may be addressed by LED current control element 422 and further connector 424 on assembly 420.

The light sources 519a-n may be mounted at an angle to match the structure 523 of light guide plate 504. The light sources 519a-n may also be mounted at an independent angle to the structure 592, 594 of the light guide plate 504. The arrangement may also comprise a further array of light sources 502a-n on base portion similar to 410 (not shown) arranged to input light in to the light guide plate 504 frocn another side. Advantageously the embodiments described can be adapted to minimize the fan-out width for different designs of directional light guide plates including those designed for one or more side illumination light sources.

Advantageously individually addressable light sources may be provided in a very compact arrangement suitable for thin displays, for example mobile displays that achieve power savings, outdoors operation, switchable privacy operation and autostereoscopic operation.

As may be used herein, the terms "substantially" and "approximately" provide an industry-accepted tolerance for its corresponding term and/or relativity between items. Such an industry-accepted tolerance ranges from zero percent to ten percent and corresponds to, but is not limited to, component values, angles, et cetera. Such relativity between items ranges between approximately zero percent to ten percent.

Embodiments of the present disclosure may be used in a variety of optical systems. The embodiment may include or work with a variety of projectors, projection systems, optical components, displays, microdisplays, computer systems, processors, self-contained projector systems, visual and/or audiovisual systems and electrical and/or optical devices. Aspects of the present disclosure may be used with practically any apparatus related to optical and electrical devices, optical systems, presentation systems or any apparatus that may contain any type of optical system. Accordingly, embodiments of the present disclosure may be employed in optical systems, devices used in visual and/or optical presentations, visual peripherals and so on and in a number of computing environments.

It should be understood that the disclosure is not limited in its application or creation to the details of the particular arrangements shown, because the disclosure is capable of other embodiments. Moreover, aspects of the disclosure may be set forth in different combinations and arrangements to define embodiments unique in their own right. Also, the terminology used herein is for the purpose of description and not of limitation.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the embodiment(s) set out in any claims that may issue from this disclosure. Specifically and by way of example, although the headings refer to a "Technical Field," the claims should not be limited by the language chosen under this heading to describe the so-called field. Further, a description of a technology in the "Background" is not to be construed as an admission that certain technology is prior art to any embodiment(s) in this disclosure. Neither is the "Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

The invention claimed is:

1. A light source array parallel connection assembly for a directional backlight, the assembly comprising:
   a mounting strip including an electrical insulator layer extending in a lateral direction, the mounting strip including an end portion and a base portion;
   an array of light sources mounted to the end portion of the mounting strip arrayed in said lateral direction, and arranged to output light in a forward direction;
   separate conductive tracks connected to each respective light source formed on the electrical insulator layer of the mounting strip and extending from the end portion onto the base portion; and
   plural flat connectors, each comprising an array of separate conductive tracks, the flat connectors being mounted in a stack on the base portion of the mounting strip, each conductive track on the mounting strip being electrically connected to a respective conductive track of one of the flat connectors, the flat connectors extending in said lateral direction along the base portion to outside the base portion, allowing electrical connection to be made to the conductive tracks of the flat connectors outside the base portion.

2. An assembly according to claim 1, wherein each conductive track on the mounting strip is directly electrically connected to a respective conductive track of one of the flat connectors.

3. An assembly according to claim 1, wherein the mounting strip further comprises a heat sink layer extending at least across said end portion on the opposite side of the electrical insulator layer from the conductive tracks.

4. An assembly according to claim 3, wherein the heat sink layer extends across the end portion and the base portion.

5. An assembly according to claim 3, wherein the heat sink layer comprises a layer of metal.

6. An assembly according to claim 5, wherein the metal is copper.

7. An assembly according to claim 3, comprising a further heat sink element thermally connected to the heat sink layer adjacent the end portion.

8. An assembly according to claim 1, further comprising respective connector blocks connected to each flat connector outside the base portion, which connector blocks allow electrical connection to be made to the conductive tracks of the flat connectors.

9. An assembly according to claim 1, wherein the conductive tracks of each flat connector are exposed outside the base portion to allow electrical connection to be made to them.

10. An assembly according to claim 1, wherein the end portion is planar and base portion is planar.

11. An assembly according to claim 1, wherein the base portion extends in the forward direction from the light sources.

12. An assembly according to claim 1, wherein the light sources are mounted to the mounting strip on a face of the end portion in a top-emitting configuration so that the forward direction is outwardly of the face.

13. An assembly according to claim 12, wherein the mounting strip is shaped so the base portion extends in the forward direction.

14. An assembly according to claim 12, wherein the mounting strip is shaped so that the base portion is disposed on the rearward side of the end portion.

15. An assembly according to claim 14, wherein the mounting strip is shaped so that the base portion is disposed on the rearward side of the end portion extending parallel to the end portion.

16. An assembly according to claim 1, wherein the light sources are mounted to the mounting strip on a face of the end portion in a side-emitting configuration so that the forward direction is across the face.

17. An assembly according to claim 16, wherein the base portion extends in the forward direction.

18. An assembly according to claim 16, wherein the base portion extends in the rearward direction.

19. A directional backlight comprising:
   a waveguide comprising an input end for receiving input light and first and second, opposed guide surfaces for guiding input light along the waveguide, wherein the second guide surface is arranged to deflect light guided through the waveguide out of the waveguide through the first guide surface as output light, and the waveguide is arranged to direct the output light into optical windows in output directions that are distributed laterally in dependence on the input position of the input light laterally along the input end; and
   an assembly according to claim 1 arranged with the light sources disposed at different input positions laterally along the input end of the waveguide, facing the input end of the waveguide for supplying said input light.

20. A directional display device comprising:
   a directional backlight according to claim 19; and
   a transmissive spatial light modulator comprising an array of pixels arranged to receive the output light from the waveguide and to modulate it to display an image.

21. A directional display apparatus comprising:
   a directional display device according to claim 20; and
   a control system connected to the flat connectors outside the base portion for providing connection to the light sources, the control system being arranged to control the light sources to direct light into optical windows for viewing by an observer.

* * * * *